United States Patent
Mishima

(10) Patent No.: US 7,910,415 B2
(45) Date of Patent: Mar. 22, 2011

(54) SEMICONDUCTOR DEVICE AND METHOD OF MANUFACTURING THE SAME, AND SEMICONDUCTOR SUBSTRATE AND METHOD OF MANUFACTURING THE SAME

(75) Inventor: Yasuyoshi Mishima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1053 days.

(21) Appl. No.: 11/585,804

(22) Filed: Oct. 25, 2006

(65) Prior Publication Data

US 2007/0059875 A1 Mar. 15, 2007

Related U.S. Application Data

(63) Continuation of application No. PCT/JP2005/008639, filed on May 11, 2005.

(30) Foreign Application Priority Data

May 13, 2004 (WO) .................. PCT/JP2004/006447

(51) Int. Cl.
*H01L 21/268* (2006.01)
(52) U.S. Cl. ........ 438/164; 438/487; 438/763; 438/799; 257/E21.347
(58) Field of Classification Search .................. 257/190, 257/191, E21.123, E21.125, E21.347; 438/142–308, 438/479–509, 758–794, 795–799
See application file for complete search history.

(56) References Cited

U.S. PATENT DOCUMENTS

| | | | |
|---|---|---|---|
| 6,339,232 B1 * | 1/2002 | Takagi | 257/192 |
| 6,972,247 B2 * | 12/2005 | Bedell et al. | 438/517 |
| 2004/0031979 A1 * | 2/2004 | Lochtefeld et al. | 257/233 |
| 2004/0094763 A1 * | 5/2004 | Agnello et al. | 257/55 |
| 2004/0108559 A1 | 6/2004 | Sugii et al. | |
| 2004/0217393 A1 * | 11/2004 | Takizawa | 257/288 |
| 2005/0032340 A1 * | 2/2005 | Takizawa | 438/489 |
| 2006/0068557 A1 * | 3/2006 | Ochimizu et al. | 438/312 |
| 2006/0134893 A1 * | 6/2006 | Savage et al. | 438/483 |

FOREIGN PATENT DOCUMENTS

JP 9-219524 A 8/1997

(Continued)

OTHER PUBLICATIONS

A.R. Powell et al., "New approach to the growth of low dislocation relaxed SiGe material", Appl. Phys. Lett. 64 (14), pp. 1856-1858 (1994).

(Continued)

*Primary Examiner* — Matthew C Landau
*Assistant Examiner* — Aaron Staniszewski
(74) *Attorney, Agent, or Firm* — Fujitsu Patent Center

(57) ABSTRACT

A method of manufacturing a semiconductor device including a substrate; an insulating film formed thereon; a first semiconductor layer where strain is induced in the directions parallel to the surface of the substrate, the first semiconductor layer being on the insulating film; a source region and a drain region formed in the first semiconductor layer; and a gate layered body formed of a gate insulating film and a gate electrode on the first semiconductor layer is disclosed. The method includes the steps of (a) forming a second semiconductor layer by epitaxial growth on the first semiconductor layer; (b) heating the second semiconductor layer; and (c) removing the second semiconductor layer. The second semiconductor layer is different in lattice constant in an in-plane direction from the first semiconductor layer. Step (b) induces the strain in the first semiconductor layer by exposing the surface of the second semiconductor layer to energy lines.

12 Claims, 16 Drawing Sheets

FOREIGN PATENT DOCUMENTS

| | | |
|---|---|---|
| JP | 10-92947 A | 4/1998 |
| JP | 10-209453 A | 8/1998 |
| JP | 2001-160594 A | 6/2001 |
| JP | 2001-257351 A | 9/2001 |
| JP | 2004-128185 A | 4/2004 |
| JP | 2004-281764 A | 10/2004 |
| JP | 2005-045115 A | 2/2005 |
| JP | 2005-50984 A | 2/2005 |
| WO | WO 2005013375 A1 * | 2/2005 |

OTHER PUBLICATIONS

S. Fukatsu et al., "SiGe-based semiconductor-on-insulator substrate created by low-energy separation-by-implanted-oxygen", Appl. Phys. Lett. 72, pp. 3485 (1998).

T. Tezuka et al., "A novel Fabrication Technique of Ultrathin and Relaxed SiGe Buffer Layers with High Ge Fraction for Sub-100 nm Strained Silicon-on-Insulator MOSFETs", Jpn. J. Appln. Phys. 40, pp. 2866 (2001).

K. Rim et al., "Fabrication and Mobility Characteristics of Ultra-thin Strained Si Directly on Insulator (SSDOI) MOSFETs", IEEE IEDM Tech Dig., pp. 49 (2003).

C. Maleville et al., "Ultra-Thin SOI and Strained Silicon-on-Insulator (SSOI)- Fabrication, Metrology & Defects", SEMI Standard Technical Education Program, SEMICON West 2003, San Francisco, Jul. 15, 2003, USA.

International Search Report of PCT/JP2005/008639 date of mailing Aug. 2, 2005.

International Search Report of PCT/JP2004/006447 date of mailing Jul. 13, 2004.

* cited by examiner

SEMICONDUCTOR DEVICE AND METHOD OF MANUFACTURING THE SAME, AND SEMICONDUCTOR SUBSTRATE AND METHOD OF MANUFACTURING THE SAME

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2005/008639, filed on May 11, 2005, which claims priority to PCT International Application No. PCT/JP2004/006447, filed on May 13, 2004. The entire contents of the foregoing applications are hereby incorporated by reference.

BACKGROUND OF THE INVENTION

1. Field of the Invention

The present invention relates to a semiconductor substrate having a semiconductor layer in which strain is induced and a method of manufacturing the same, and to a semiconductor device using the semiconductor substrate and a method of manufacturing the same.

2. Description of the Related Art

Semiconductor devices have improved in performance so as to attain high-speed operation, low power consumption, and high integration because of progress in miniaturization of their minimum processing size. Lately, in order to increase operating speed, studies have been made of improving carrier mobility in the channel part of a transistor by employing a SiGe film and using the heterostructure of a Si film and the SiGe film or the properties of the SiGe film itself.

With respect to n-type MOS (Metal Oxide Semiconductor) or n-MOS transistors, it has been proposed to form a heterostructure having a SiGe film and a Si film epitaxially grown in the (001) plane direction thereon and induce tensile strain in the Si film by applying tensile stress to the Si film from the SiGe film using the fact that the SiGe film has a greater lattice constant than the Si film. It is known that electron mobility in the strain direction is better in such a Si film in which tensile strain is induced so that the performance of the n-MOS transistor can be improved by using such a Si film as a channel.

Further, with respect to p-type MOS (p-MOS) transistors, it has been proposed to form source and drain regions of SiGe in part of the surface of a SiGe substrate having a Ge concentration of 20-30% or a Si substrate and apply compressive strain to the channel of the Si film from both regions. It is known that such a configuration improves the hole mobility of the Si film so that the performance of the p-MOS transistor can be improved.

Further, in order to improve the performance of transistors, there has been proposed a so-called strained SOI (Silicon On Insulator) substrate, or a substrate in which the technology of SOI having a thin Si film for suppressing the parasitic capacitance and the short channel effect of transistors and the above-mentioned strain technology are merged.

According to one method of forming an SOI substrate in which strain is induced in a thin Si film, a SiGe film is caused to grow on a Si substrate, and a buried oxide film is formed at the interface between the Si substrate and the SiGe film by oxygen ion implantation and high temperature heat treatment using SIMOX (Separation by Implanted Oxygen) processing. Then, a Si film is formed on the SiGe film, and tensile strain is induced in the Si film (see Non-Patent Documents 1 and 2 described below).

According to another method, a thick SiGe film is caused to grow on a Si substrate by epitaxial growth, and the strain of the SiGe film is relaxed by heat treatment. A Si film is formed on the SiGe film, and tensile strain is induced in the Si film by the SiGe film, so that a strained Si film is formed. Then, hydrogen ions are implanted to a predetermined depth in the SiGe film under the strained Si film. Then, a separately prepared Si substrate having a thermal oxide film formed on its surface (Si substrate/thermal oxide film) is stuck to the substrate on which the strained Si film is formed. The SiGe film/strained Si film is separated by cleaving from the region in which the hydrogen ions are implanted, and the SiGe film is removed so that the strained Si film is exposed, thereby forming a strained SOI substrate of Si substrate/thermal oxide film/strained Si film (see Non-Patent Documents 3 and 4 described below).

[Non-Patent Document 1] S. Fukatsu et al., Appl. Phys. Lett. 72, pp. 3485 (1998)

[Non-Patent Document 2] T. Tezuka et al., Jpn. J. Appl. Phys. 40, pp. 2866 (2001)

[Non-Patent Document 3] K. Rim et al., IEEE IEDM Tech Dig., pp. 49 (2003)

[Non-Patent Document 4] C. Maleville et al., Ultra-Thin SOI and Strained Silicon-on-Insulator, Fabrication, Metrology, and Defects (SEMI Standard Technical Education Program, SEMICON West 2003, San Francisco, Jul. 15, 2003, USA)

However, according to the methods of Non-Patent Documents 3 and 4, the surface of the SiGe film should be smoothed in order to cause smooth crystal growth of the strained Si film. Further, since the cleavage surface of the SiGe film is uneven, planarization by CMP (chemical mechanical polish) is required. However, the strained Si film formed under the SiGe film is at most approximately 20 nm in thickness, and it is extremely difficult for CMP to achieve both surface flatness and uniform thickness of the strained Si film of approximately 20 nm in thickness, thus causing the problem of an extremely low yield. This results in a problem in that the cost of manufacturing an SOI substrate is extremely high.

SUMMARY OF THE INVENTION

Embodiments of the present invention may solve or reduce one or more of the above-described problems.

According to one aspect of the present invention, a semiconductor substrate in which the above-described problems are solved and a method of manufacturing the same, and a semiconductor device using the semiconductor substrate and a method of manufacturing the same are provided.

According to another aspect of the present invention, a semiconductor substrate having a high-quality strained Si film and a method of manufacturing the semiconductor substrate in a simplified manner are provided.

According to yet another aspect of the present invention, a semiconductor device capable of high-speed operation and a method of manufacturing the same are provided.

According to one embodiment of the present invention, there is provided a method of manufacturing a semiconductor device, the semiconductor device including a substrate; an insulating film formed on the substrate; a first semiconductor layer in which strain is induced in directions parallel to a surface of the substrate, the first semiconductor layer being on the insulating film; a source region and a drain region formed in the first semiconductor layer; and a gate layered body formed of a gate insulating film and a gate electrode on the first semiconductor layer, the method including the steps of:

(a) forming a second semiconductor layer by epitaxial growth on the first semiconductor layer; (b) heating the second semiconductor layer; and (c) removing the second semiconductor layer, wherein the second semiconductor layer is different in lattice constant in an in-plane direction from the first semiconductor layer; and step (b) induces the strain in the first semiconductor layer by exposing a surface of the second semiconductor layer to energy lines.

According to this embodiment, the second semiconductor layer that induces strain is formed on the first semiconductor layer. Then, the surface of the second semiconductor layer is heated by being exposed to energy lines, thereby relaxing the strain in the second semiconductor layer. At this point, since the second semiconductor layer is different in lattice constant in the in-plane direction from the first semiconductor layer, stress is applied to the first semiconductor layer from the second semiconductor layer, so that strain is induced in the first semiconductor layer. As a result, the electron mobility of the strain-induced first semiconductor layer can be improved. Further, since the second semiconductor layer is removed after strain is induced in the first semiconductor layer, it is possible to prevent the atoms of an element forming the second semiconductor layer from diffusing into and remaining in the first semiconductor layer. Consequently, it is possible to realize a semiconductor device having a high-quality, strain-induced semiconductor layer (first semiconductor layer).

According to one embodiment of the present invention, there is provided a method of manufacturing a semiconductor device, the semiconductor device including a substrate; an insulating film formed on the substrate; a first semiconductor layer formed on the insulating film; an n-type MOS transistor formed in a first region of the first semiconductor layer; a second semiconductor layer formed on a second region of the first semiconductor layer; and a p-type MOS transistor formed in the second semiconductor layer, the method including the steps of: (a) forming the second semiconductor layer by epitaxial growth on the first semiconductor layer; (b) heating the second semiconductor layer on the first region of the first semiconductor layer; and (c) removing the second semiconductor layer on the first region of the first semiconductor layer, wherein the second semiconductor layer is greater in lattice constant in an in-plane direction than the first semiconductor layer in a strain-free condition; and step (b) induces tensile strain in the first semiconductor layer by exposing a surface of the second semiconductor layer to energy lines.

According to this embodiment, the second semiconductor layer greater in lattice constant in the in-plane direction than the first semiconductor layer in a strain-free condition is formed on the first semiconductor layer, and the second semiconductor layer on the first region of the first semiconductor layer is heated. As a result, tensile stress is applied to the first semiconductor layer from the second semiconductor layer, so that tensile strain is induced in the first semiconductor layer. Consequently, it is possible to increase the operating speed of the n-type MOS transistor using the first region of the first semiconductor layer as a channel layer. Further, compressive strain is induced in the second semiconductor layer formed on the second region of the first semiconductor layer at the time of its epitaxial growth on the first semiconductor layer. As a result, it is possible to increase the operating speed of the p-type MOS transistor using the second semiconductor layer on the second region as a channel layer.

According to one embodiment of the present invention, there is provided a semiconductor device including: a substrate; an insulating film formed on the substrate; a first semiconductor layer having a first region and a second region, the first region having tensile strain in directions parallel to a surface of the substrate, the first semiconductor layer being formed on the insulating film; an n-type MOS transistor including a source region and a drain region formed in the first region, and a gate insulating film and a gate electrode on the first semiconductor layer in the first region; a second semiconductor layer having compressive strain in the directions parallel to the surface of the substrate, the second semiconductor layer being formed on the first semiconductor layer in the second region; and a p-type MOS transistor including a source region and a drain region formed in the second semiconductor layer, and a gate insulating film and a gate electrode on the second semiconductor layer, wherein the second semiconductor layer is greater in lattice constant in an in-plane direction than the first semiconductor layer in a strain-free condition.

According to this embodiment, the channel of the n-type MOS transistor is formed in the tensile strain-induced first semiconductor layer having high electron mobility, and the p-type MOS transistor is formed in the compressive strain-induced second semiconductor layer having high hole mobility. Therefore, it is possible to realize a semiconductor device in which the n-type MOS transistor and the p-type MOS transistor can operate at high speed.

According to one embodiment of the present invention, there is provided a method of manufacturing a semiconductor substrate, the semiconductor substrate including a substrate; an insulating film formed on the substrate; and a first semiconductor layer in which strain is induced in directions parallel to a surface of the substrate, the first semiconductor layer being on the insulating film, the method including the steps of: (a) forming a second semiconductor layer by epitaxial growth on the first semiconductor layer; (b) heating the second semiconductor layer; and (c) removing the second semiconductor layer, wherein the second semiconductor layer is different in lattice constant in an in-plane direction from the first semiconductor layer; and step (b) induces the strain in the first semiconductor layer by exposing a surface of the second semiconductor layer to energy lines.

According to one embodiment of the present invention, there is provided a method of manufacturing a semiconductor substrate, the semiconductor substrate including a substrate; an insulating film formed on the substrate; a Si film in which strain is induced in directions parallel to a surface of the substrate, the Si film being on the insulating film; and a Ge film formed on the Si film, the method including the steps of: (a) forming a semiconductor layer by epitaxial growth on the Si film; (b) heating the semiconductor layer; (c) removing the semiconductor layer; and (d) forming the Ge film by epitaxial growth on the strain-induced Si film, wherein the semiconductor layer is greater in lattice constant in an in-plane direction than the Si film; and step (b) induces the strain in the Si film by exposing a surface of the semiconductor layer to energy lines.

According to this embodiment, the second semiconductor layer that induces strain is formed on the first semiconductor layer, and the second semiconductor layer is heated by being exposed to energy lines, so that strain is induced in the first semiconductor layer, thereby making it possible to increase electron mobility or hole mobility. Further, since the second semiconductor layer is removed, it is possible to prevent the atoms of an element forming the second semiconductor layer from diffusing into and remaining in the first semiconductor layer. As a result, it is possible to realize a semiconductor substrate having a strain-induced, high-quality semiconductor layer (first semiconductor layer).

According to one embodiment of the present invention, there is provided a method of manufacturing a semiconductor substrate, the semiconductor substrate including a substrate; an insulating film formed on the substrate; a first semiconductor layer having a first region in which tensile strain is induced in directions parallel to a surface of the substrate, the first semiconductor layer being formed on the insulating film; and a second semiconductor layer formed on a second region of the first semiconductor layer, the method including the steps of: (a) forming the second semiconductor layer by epitaxial growth on the first semiconductor layer; (b) heating the second semiconductor layer on the first region of the first semiconductor layer; and (c) removing the second semiconductor layer on the first region of the first semiconductor layer, wherein the second semiconductor layer is greater in lattice constant in an in-plane direction than the first semiconductor layer; and step (b) induces the tensile strain in the first semiconductor layer by exposing a surface of the second semiconductor layer to energy lines.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given below, with reference to the accompanying drawings, of embodiments of the present invention.

First Embodiment

A first embodiment of the present invention relates to a semiconductor substrate having a strained Si film in which tensile strain is induced in a crystal lattice, and a method of manufacturing the same.

Figure 1:
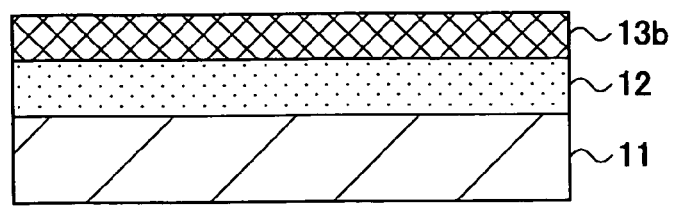
FIG. 1 is a cross-sectional view of a semiconductor substrate according to a first embodiment of the present invention.

FIG. 1 is a cross-sectional view of a semiconductor substrate 10 according to the first embodiment of the present invention. Referring to FIG. 1, the semiconductor substrate 10 includes a single-crystal silicon substrate 11, a silicon oxide film 12 stacked thereon, and a strained Si film 13b stacked thereon. Tensile strain is induced in the directions parallel to the surface of the single-crystal silicon substrate 11 (hereinafter referred to as "in-plane direction") in the strained Si film 13b. The strained Si film 13b has a diamond crystal structure. The surface of the strained Si film 13b is a (001) plane, and the direction of film thickness is a [001] direction. In the strained Si film 13b, tensile strain is induced in the in-plane direction and compressive strain is induced in the thickness direction. In the strained Si film 13b, since tensile strain is induced in the in-plane direction, the electron mobility in the in-plane direction is improved. Accordingly, by forming an n-type MOS transistor having a channel in the in-plane direction of the strained Si film 13b using this semiconductor substrate 10, it is possible to increase the operating speed of the transistor. Further, as described in detail below in Example 1, the Ge content of the strained Si film 13b is extremely lower than the Ge content of the strained Si film in which tensile strain is induced of the conventional SOI substrate. With respect to the Ge content of the strained Si film 13b, according to SIMS (Secondary Ion Mass Spectrometry) measurement in the depth direction (film thickness direction) of the strained Si film 13b, it is preferable that the maximum value of the moving averages of the Ge content in the depth direction be less than or equal to $3 \times 10^{18}$ atoms/cm$^{-3}$. This is smaller than the maximum value of the moving averages of the Ge content of a strained Si film formed by the conventional sticking method. By reducing the Ge content of the strained Si film 13b, an increase in the interface state is suppressed in the case of using the strained Si film 13b as a channel, so that it is possible to prevent a decrease in carrier mobility. Further, if the maximum value of the moving averages of the Ge content in the depth direction exceeds $3 \times 10^{18}$ atoms/cm$^{-3}$, the Ge atoms of the strained Si film 13b are oxidized and vaporized so that the crystallinity of the strained Si film 13b is likely to be degraded when the strained Si film 13b is exposed to an oxygen atmosphere. Degradation of the crystallinity of the strained Si film 13b reduces electron mobility. Further, the lower the Ge content of the strained Si film 13b, the better in suppressing formation of the interface state and avoiding degradation of crystallinity. The Ge content is higher than or equal to $2\text{-}4\times10^{17}$ atoms/cm$^{-3}$ in terms of the detection limit of SIMS. An explanation of the moving average is given in an example below.

Further, Ge atoms enter only the extreme surface layer of the strained Si film 13b according to a manufacturing method described next. More specifically, as shown below in FIG. 6, Ge atoms enter the strained Si film 13b only to the depth of 3 nm or less from the surface according to SIMS measurement. The depth of entrance of Ge atoms is from the surface of the strained Si film 13b to where the Ge content is less than or equal to $2\times10^{18}$ atoms/cm$^{-3}$. As described below in Example 1, the depth of entrance of the Ge atoms of the strained Si film 13b is extremely smaller than that of an SOI substrate having a conventional strained Si film. This reduces the entire amount of Ge atoms contained in the strained Si film 13b, so that it is possible to suppress formation of the interface state and avoid degradation of crystallinity.

Further, a channel and a shallow junction region are formed only in a region close to the surface of the strained Si film 13b also in the case of applying the technique of reducing the vertical dimension of a semiconductor device in order to realize a semiconductor device that operates at high speed. In such a case, Ge atoms are contained only in the extremely shallow region at the surface of the strained Si film 13b of the semiconductor substrate 10. Accordingly, compared with an SOI substrate having a conventional strained Si film, it is possible to reduce the degree of adverse effects exerted by Ge atoms, such as formation of the interface state and degradation of crystallinity, in the semiconductor substrate 10. Further, since diffusion of impurity ions due to ion implantation is also suppressed, it is easy to control the profile of the impurity ions.

FIGS. 2A through 2E are diagrams showing a process for manufacturing a semiconductor substrate according to the first embodiment.

Figure 2A:
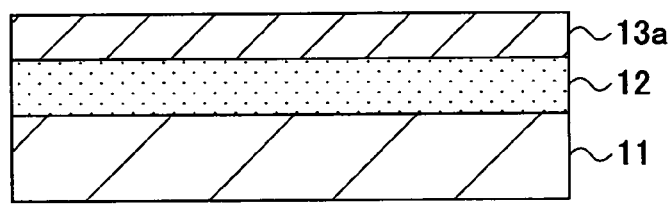
FIGS. 2A through 2E are diagrams showing a process for manufacturing a semiconductor substrate according to the first embodiment of the present invention.

First, in the process of FIG. 2A, a natural oxide film (not graphically illustrated) on the surface of the single-crystal silicon substrate 11 having a (001) plane is removed using hydrofluoric acid. Thereafter, a Si film 13a (for example, 100 nm in thickness) is formed by epitaxial growth using molecular epitaxy or CVD (chemical vapor deposition) such as ultrahigh vacuum CVD, hydrogen reduction, thermal decomposition, or MOCVD (metal organic CVD). The Si film 13a is a single-crystal film having a (001) plane.

Further, in the process of FIG. 2A, oxygen ions are implanted while heating the single-crystal silicon substrate 11 to approximately 600° C. Further, the silicon oxide film 12 (buried oxide film) is formed between the single-crystal silicon substrate 11 and the Si film 13a, by high-temperature annealing at 1300° C., so that an SOI substrate 15 is formed with the Si film 13a of approximately 20 nm in thickness remaining at the surface. The thickness of the Si film 13a is selected depending on the type of semiconductor device to be formed on the semiconductor substrate 10.

In addition to the above-described SIMOX method, sticking and other known methods may be employed to form the SOI substrate 15. Further, the SOI substrate 15 is not limited to a single-crystal silicon substrate, and other substrates such as a sapphire ($Al_2O_3$) substrate and a silicon carbide (SiC) substrate may also be employed.

Figure 2B:
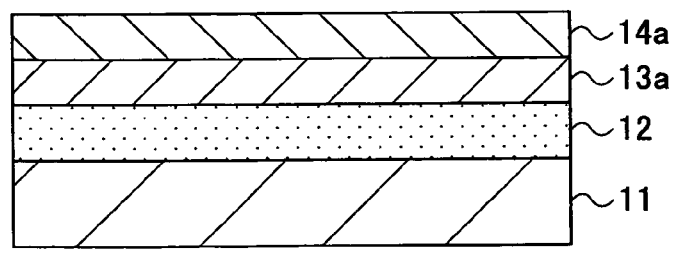

Next, in the process of FIG. 2B, a SiGe film 14a of 40 nm in thickness is formed by epitaxial growth on the surface of the Si film 13a using molecular epitaxy or CVD (such as ultrahigh vacuum CVD, hydrogen reduction, thermal decomposition, or MOCVD). The SiGe film 14a grows so that its (001) plane is parallel to the substrate surface, and the SiGe film 14a forms a heterostructure with the Si film 13a. The SiGe film 14a is substantially coherent with the Si film 13a (has substantially the same lattice constant as the Si film 13a) at the interface with the Si film 13a, and the higher in the SiGe film 14a, the closer to its inherent lattice constant. Accordingly, compressive strain is caused in the SiGe film 14a (strained SiGe film), and is great at the interface with the Si film 13a in particular.

Specifically, formation of the SiGe film 14a is performed for 3 minutes by, for example, ultrahigh vacuum CVD, using $Si_2H_6$ as a source gas of Si (flow rate of 2 sccm) and $GeH_4$ as a source gas of Ge (flow rate of 4 sccm) at a substrate temperature of 550° C. at a pressure of $10^{-4}$ Pa.

The thickness of the SiGe film 14a is within the range of 5 nm to 60 nm, preferably 10 nm to 40 nm. With this thickness, a defect may be caused in the SiGe film 14a. However, since the SiGe film 14a is eventually removed, this does not affect the quality of the strained SOI substrate. With respect to the composition of the SiGe film 14a, letting the Ge concentration be expressed as x at. %, it is preferable that the Ge concentration x be within the range of 10 at. % to 40 at. %. If the Ge concentration x is lower than 10 at. %, tensile stress is not applied sufficiently to the Si film 13a. On the other hand, if the Ge concentration x is higher than 40 at. %, dislocation is likely to occur at the interface with the Si film 13a, so that the tensile strain induced in the Si film 13a is non-uniform. Further, it is preferable that the Ge concentration x of the SiGe film 14a be within the range of 15 at. % to 30 at. % in terms of easy formation of the SiGe film 14a with good crystallinity. In the following, the composition of the SiGe film is expressed as $Si_{100-x}Ge_x$, letting the Ge concentration be x at. %.

The ratio of thickness of the SiGe film 14a to the Si film 13a is suitably determined. It is preferable that SiGe film 14a/Si film 13a (thickness ratio) be within the range of 0.2 to 30 in terms of sufficient application of tensile stress from the SiGe film 14a to the Si film 13a.

It is preferable that the substrate temperature at the time of forming the SiGe film 14a be within the range of 450° C. to 750° C. If the substrate temperature is lower than 450° C., the Si/Ge composition ratio changes depending on the composition of the SiGe film 14a, so that dislocation is likely to occur at the interface with the Si film 13a. This results in reduction in the amount of tensile strain induced in the Si film 13a in the next process. If the substrate temperature is higher than 750° C., the diffusion of impurities occurs if the impurities have been implanted, so that the impurity profile changes. An oxide film on the surface of the Si film 13a may be removed using hydrofluoric acid before forming the SiGe film 14a.

Figure 2C:
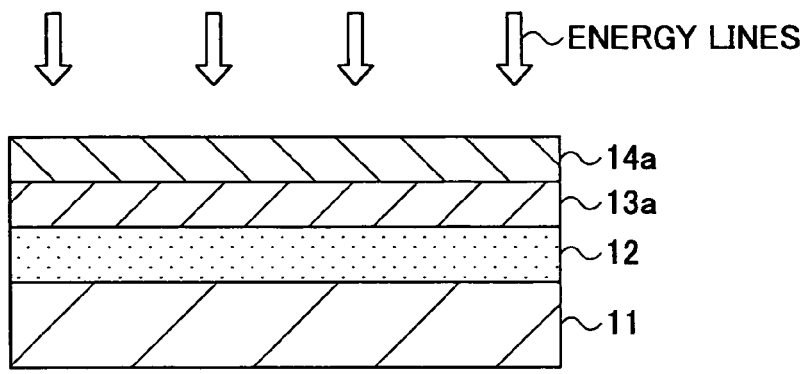
Figure 2D:
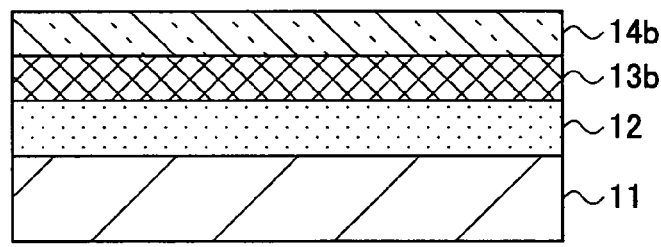

Next, in the process of FIG. 2C, energy lines are emitted onto the surface of the SiGe film 14a. For example, laser light is emitted onto the surface of the SiGe film 14a using a XeCl excimer laser (of a wavelength of 308 nm and an exposure energy of 280 mJ/cm$^2$). This laser light emission relaxes the compressive strain of the SiGe film 14a, so that tensile stress is applied to the Si film 13a. Since the Si film 13a is weakly joined to its underlayer silicon oxide film 12, this joining is broken by heating by the conducted heat by the laser light emission and tensile stress applied from the Si film 13a. As a result, tensile stress is induced over the entire Si film 13a in its depth direction. Thus, the lattice-relaxed SiGe film 14b and the strained Si film 13b in which tensile strain is induced are formed as shown in FIG. 2D.

The laser light source employed for laser light emission is not limited in particular. Gas lasers of $CO_2$, CO, He—Ne, Ar ions, excimer, etc., and solid-state lasers of Nd:YAG, ruby, etc., may be employed. Laser light sources of either pulse laser oscillation or continuous laser oscillation may be employed. Laser light may be emitted onto a predetermined exposure position using a galvano scanner or a polygon mirror. Alternatively, the entire substrate may be exposed to laser light at a time. In the case of using a laser light source of continuous laser oscillation, scanning may be performed using a galvano scanner or a polygon mirror in order to control the position to be exposed, exposure time, and exposure energy.

It is preferable that the exposure time be less than or equal to 10 ms. The shorter the exposure time, the more preferable in terms of avoiding heating the silicon oxide film globally. However, the exposure time is preferably 1 ns or more, and more preferably 10 ns or more in terms of practical use.

The laser light is preferably shorter in wavelength than visible light (400 nm to 760 nm in wavelength) in terms of high exposure energy density. The laser light is more preferably in the range of 150 nm to 400 nm in terms of easy conversion from light into heat at the topmost surface of the SiGe film 14a. The depth of entrance of such short-wavelength light into the SiGe film 14a is small (shallow), so that diffusion of Ge atoms into the Si film 13a is further prevented. Examples of such a laser light source include a XeCl excimer laser (308 nm wavelength), a KrF excimer laser (248 nm wavelength), an ArF excimer laser (193 nm wavelength), and a $F_2$ excimer laser (157 nm wavelength).

The exposure energy is determined so that temperature is such that the compressive strain of the SiGe film 14a is relaxed and the joining of the Si film 13a and the silicon oxide film 12 is broken so that compressive strain is induced in the Si film 13a. The exposure energy is suitably determined in accordance with the thickness of the SiGe film 14a and the thickness of the Si film 13a. Further, the exposure energy may be controlled by emitting multiple pulses onto a single point in relation to exposure energy density.

Laser light exposure may be either surface exposure or spot exposure. It is preferable to expose the entire surface to be exposed at a time. This makes it possible to induce strain uniformly in the Si film 13a.

In this process, besides exposure to laser light, exposure to a flash lamp and exposure to an electron beam may also be employed. In the case of using a flash lamp, the exposure time of a single flash is a few μs, and the exposure energy is 100 $mJ/cm^2$, for example. Examples of the flash lamp include a xenon flash lamp and a tungsten-halogen lamp. Further, in the case of using an electron beam, the acceleration voltage is 5 keV to 10 keV, the exposure energy is approximately 10 μA, and the exposure time is approximately 5 ns to 10 ns.

Figure 2E:
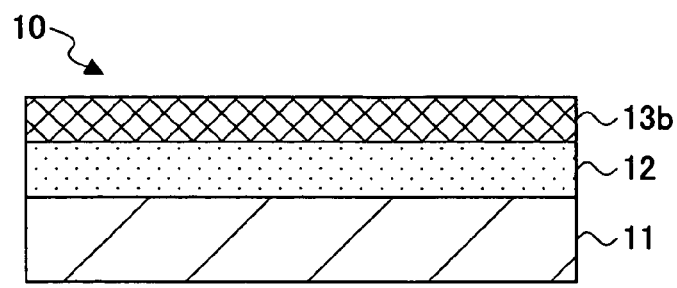

Next, in the process of FIG. 2E, the SiGe film 14b is removed from the structure of FIG. 2D by wet etching. Specifically, a liquid mixture of hydrofluoric acid, oxygenated water, and acetic acid is used as the etching liquid. The liquid mixture is set at a liquid temperature of, for example, 25° C., and is applied on the surface of the structure of FIG. 2D by spray etching, thereby dissolving and removing only the SiGe film 14b. Then, the surface of the exposed strained Si film 13b is cleaned and rinsed with pure water, and is dried. Such etching liquid has a higher etching rate for SiGe than for Si, thus having etching selectivity. Therefore, it is possible to stop etching at the interface of the SiGe film 14b and the strained Si film 13b with good controllability. Accordingly, since the SiGe film 14b is prevented from remaining, the remaining of Ge atoms on the surface of the strained Si film 13b is suppressed. Further, since the surface of the strained Si film 13b is not etched, the strained Si film 13b has a smooth surface. Alternatively, the SiGe film 14b may be removed using dipping, spin coating, or jet etching. Further, at the time of removing the SiGe film 14b, the surface of the strained Si film 13b may be overetched for 0.1 nm to 3 nm in film thickness. By thus removing the extreme surface layer of the strained Si film 13b in which Ge atoms are diffused, it is possible to obtain the strained Si film 13b with a lower Ge content. In particular, overetching is effective because in this method of manufacturing a semiconductor substrate, the diffusion of Ge atoms into the strained Si film 13b is limited to its extreme surface layer only. The overetching of the strained Si film 13b may be performed either at the time of removing the SiGe film 14b or separately after removing the SiGe film 14b. Thereby, the semiconductor substrate 10 shown in FIG. 2E, having the strained Si film 13b in which tensile strain is induced, is formed.

Next, a description is given of an example according to the first embodiment.

First, the relationship between the exposure energy of laser light emitted onto the surface of the SiGe film and the strain induced in the Si film in the process of FIG. 2C was determined.

Figure 3:
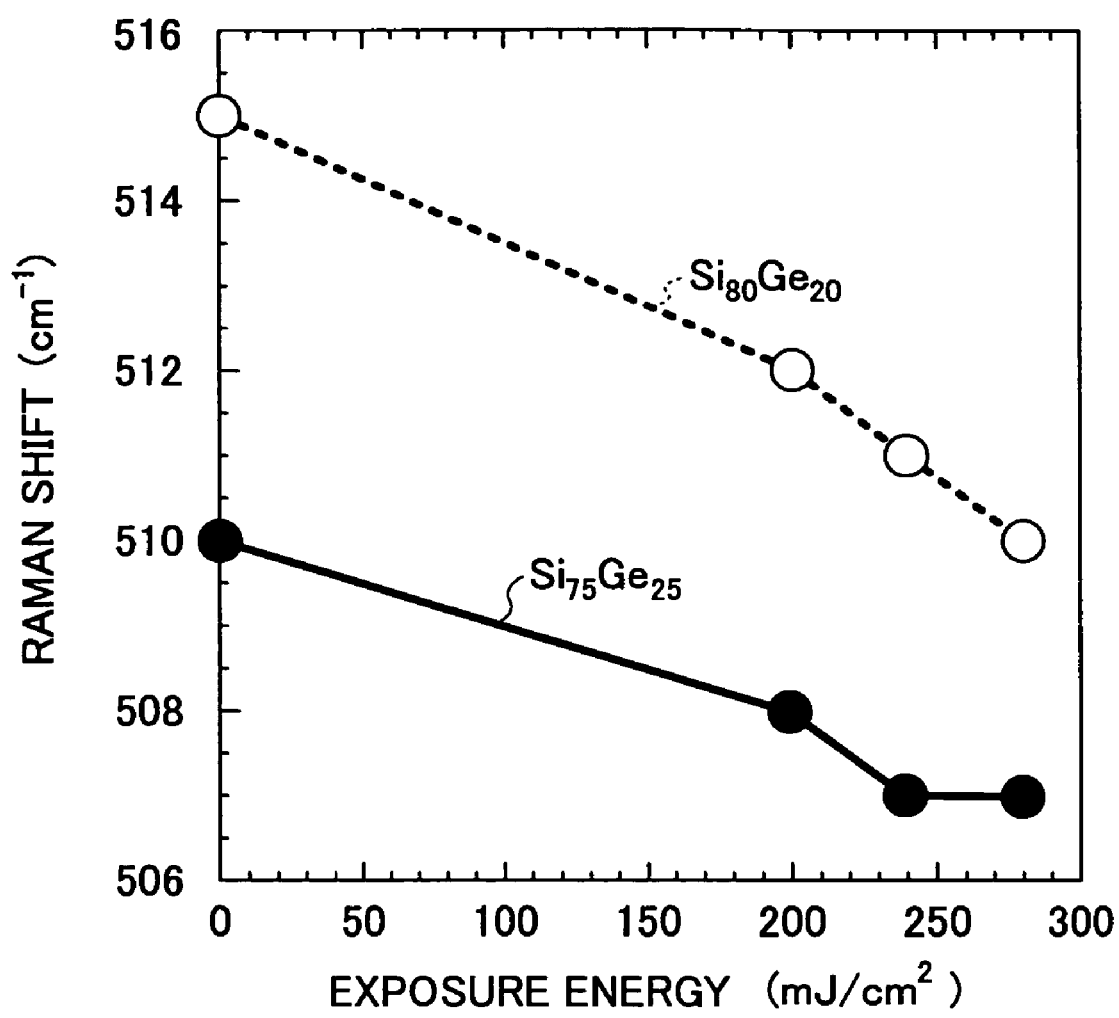
FIG. 3 is a graph showing the relationship between the Raman shifts of SiGe films and exposure energy according to the first embodiment of the present invention.

FIG. 3 is a graph showing the relationship between the Raman shifts of SiGe films and the exposure energy. In the case of FIG. 3, the strained Si films employed a $Si_{80}Ge_{20}$ film and a $Si_{75}Ge_{25}$ film (the numbers indicate the atomic percentages of the corresponding elements) as their respective SiGe films, and strain was induced by changing the exposure energy from 0 $mJ/cm_2$ (no laser exposure) to 280 $mJ/cm^2$. A XeCl laser (308 nm wavelength) was used, and laser exposure was performed by emitting a pulse of 40 ns multiple times at 100 Hz. The exposure energy indicates the total exposure energy. Further, the Si film and the SiGe film were 20 nm and 40 nm, respectively, in thickness. The SiGe film was formed under the above-described conditions by ultrahigh vacuum CVD. FIG. 3 shows the measurements of changes in the peak of each of such SiGe films around 520 $cm^{-1}$ using a Raman spectrometer. If the peak shifts to the lower wave number side, or a Raman shift occurs, this shows that tensile strain is induced in the Si film by the SiGe film.

Referring to FIG. 3, it is observed that compared with the case of no laser exposure (0 $mJ/cm^2$), the Raman shift of the Si film changes to the lower wave number side in the case of exposing the SiGe film to 200-280 $mJ/cm^2$, showing that tensile strain is induced in the Si film. Further, FIG. 3 shows that a greater tensile strain is induced in the Si film in the case of using the $Si_{75}Ge_{25}$ film than in the case of the $Si_{80}Ge_{20}$ film because the Raman shift value is smaller in the case of using the $Si_{75}Ge_{25}$ film than in the case of the $Si_{80}Ge_{20}$ film. That is, it is shown that a greater tensile strain can be induced in the Si film by using a SiGe film with a higher Ge concentration. This is because the lattice constant of a SiGe film is greater with a higher Ge concentration. The Raman shift value of the Si film in the case of no laser exposure differs between the case of using the $Si_{80}Ge_{20}$ film and the case of using the $Si_{75}Ge_{25}$ film. It is inferred that this is because in each case, the tensile strain received from the corresponding SiGe film at the time of its formation remains on the Si film.

Figure 4:
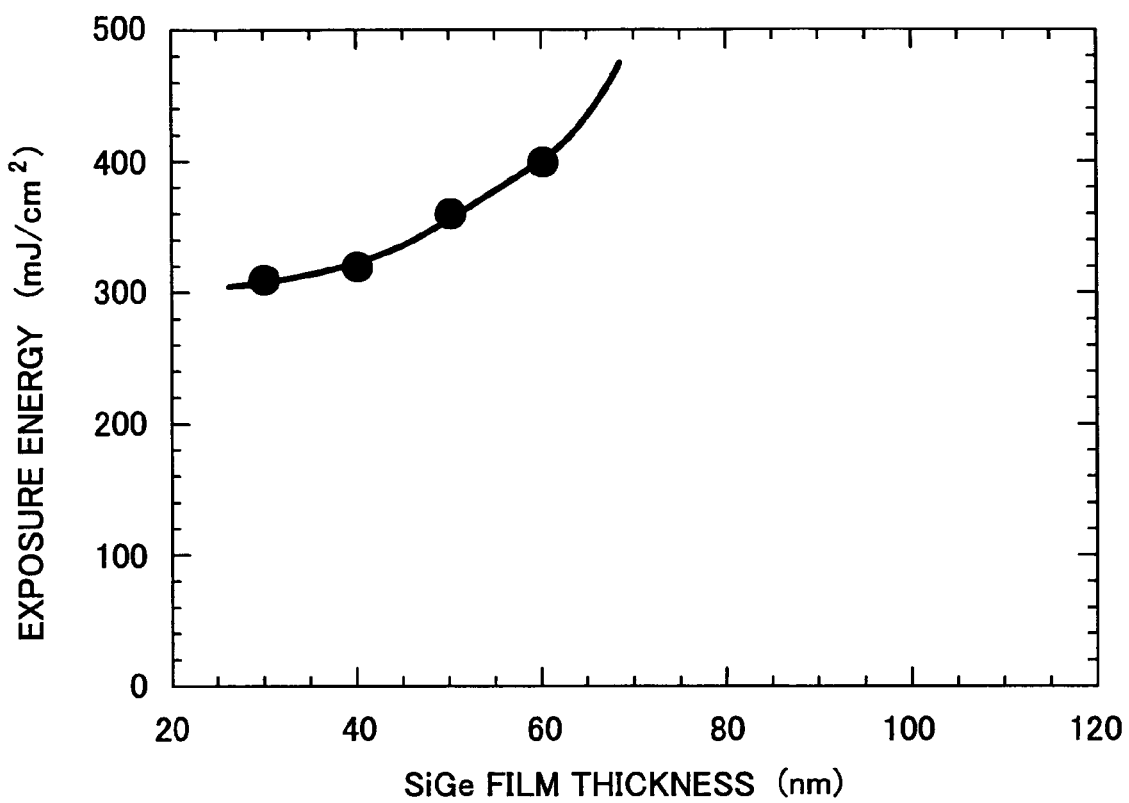
FIG. 4 is a graph showing the relationship between the exposure energy of laser exposure and the thickness of a SiGe film according to the first embodiment of the present invention.

FIG. 4 is a graph showing the relationship between the exposure energy of laser exposure and the thickness of a SiGe film. FIG. 4 shows minimum exposure energy with which strain is induced in the Si film by each SiGe film having a different thickness. In the case of FIG. 4, $Si_{80}Ge_{20}$ films of 30 nm, 40 nm, 50 nm, 60 nm, 80 nm, and 100 nm in thickness were formed as SiGe films under the above-described conditions of this embodiment by ultrahigh vacuum CVD. The same laser as in the case of FIG. 3 was employed. Further, the Si film was 20 nm in thickness. Formation of the strain of the Si film was determined by measuring the Raman shift of the SiGe film using a Raman spectrometer. When the SiGe film was relaxed, it was determined that strain was formed in the Si film.

Referring to FIG. 4, it was possible to induce strain in the Si film within the exposure energy range of approximately 300 mJ/cm² to approximately 400 mJ/cm² when the SiGe film was 30 nm to 60 nm in thickness. On the other hand, when the SiGe film was 80 nm and 100 nm in thickness, it was not possible to induce strain in the Si film with appropriate exposure energy. These data show that the SiGe film is preferably 30 nm to 60 nm in thickness. There is good reason to expect that it is possible to induce strain in the Si film even if the SiGe film is less than 30 nm in thickness.

Figure 5:
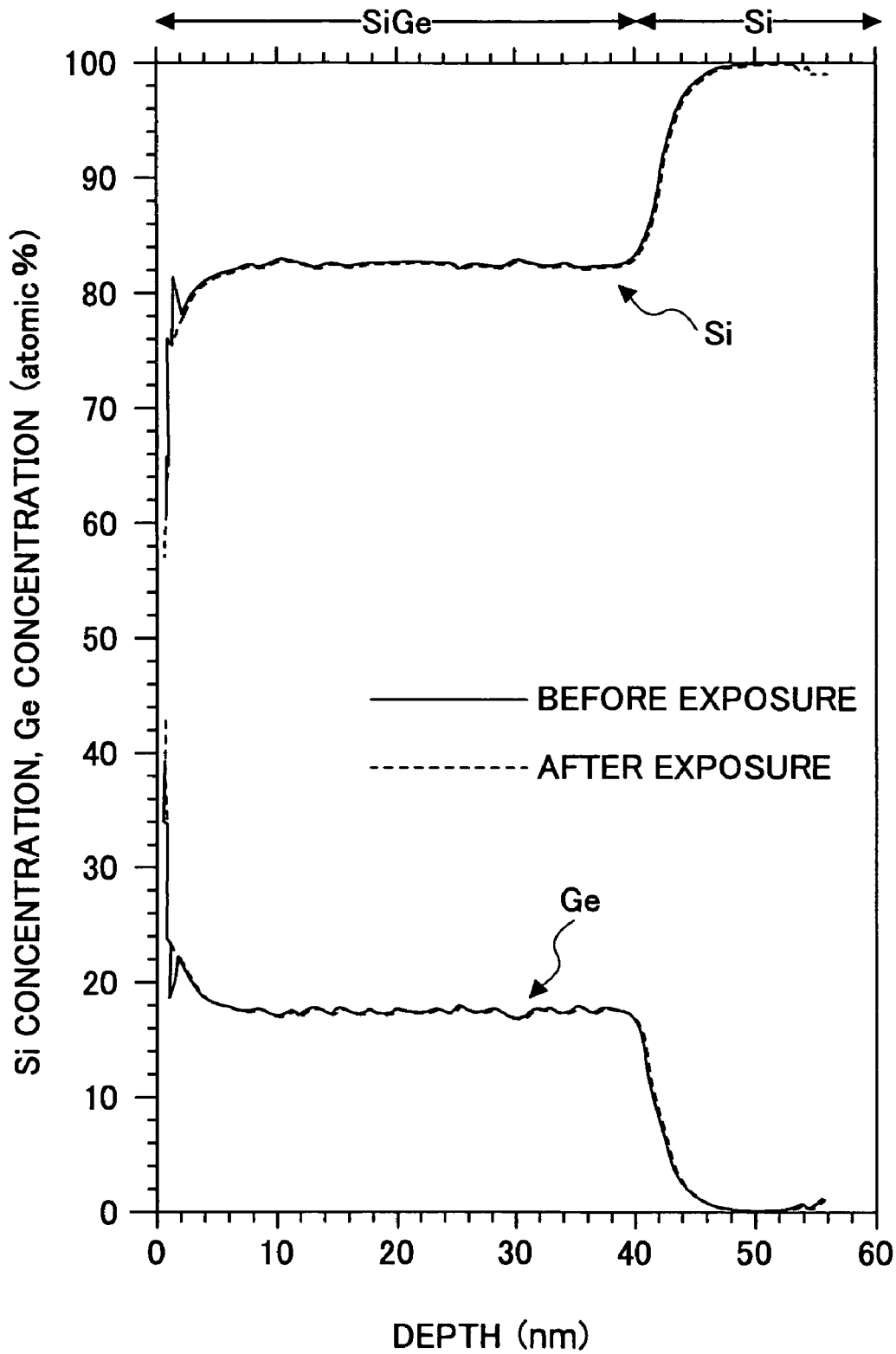
FIG. 5 is a graph showing the depth profiles of a layered body of silicon oxide film/Si film/SiGe film before and after laser exposure according to the first embodiment of the present invention.

FIG. 5 is a graph showing the depth profiles of a layered body of silicon oxide film/Si film/SiGe film before and after laser exposure. In the case of FIG. 5, quantitative analysis of Si and Ge was performed using SIMS while etching the layered body of silicon oxide film/Si film/SiGe film shown above in FIG. 2D from its surface using Ar ions. The Si film was 20 nm in thickness. The SiGe film was a $Si_{83}Ge_{17}$ film of 40 nm in thickness, formed under the above-described conditions by ultrahigh vacuum CVD. The profile before laser exposure is indicated by solid lines, and the profile after laser exposure is indicated by broken lines.

Referring to FIG. 5, the profile after laser exposure is on top of the profile before laser exposure, showing that no diffusion of Ge atoms is caused by heating the SiGe film and the Si film by laser exposure. Accordingly, with brief heating such as laser exposure, it is possible to prevent diffusion of Ge atoms into a Si film, and reduction in carrier mobility due to an increase in interface state caused by using the Si film, which cannot be avoided by conventional annealing or the like.

In FIG. 5, the Ge concentration at the interface of the Si film and the SiGe film varies over about several nm, which is considered to be due to the influence of the depth resolution of the SIMS analysis and the inclination of the sample. Even if Ge atoms are diffused into the Si film at the time of forming the SiGe film, the Ge atoms are prevented from remaining in the strained Si film since the Ge atoms are removed in the above-described process of FIG. 2E.

Next, a semiconductor substrate according to Example 1 of this embodiment was formed as follows. The semiconductor substrate includes a silicon substrate, a silicon oxide film, and a strained Si film.

First, a layered body of a silicon substrate, a silicon oxide film, and a Si film (15 nm in thickness) was formed by the above-described method. Next, film formation was performed on the Si film for 3 minutes by ultrahigh vacuum CVD, using $Si_2H_6$ (flow rate of 2 sccm) as a source gas of Si and $GeH_4$ (flow rate of 4 sccm) as a source gas of Ge, at a pressure of $10^{-4}$ Pa and at a substrate temperature of 550° C. Thereby, a $Si_{80}Ge_{20}$ film of 30 nm in thickness was caused to grow on the Si film.

Next, tensile strain was formed in the Si film by exposing the surface of the $Si_{80}Ge_{20}$ film to a single shot of a laser pulse having a pulse width of 40 ns with an energy density of 240 mJ/cm² using an excimer laser (308 nm wavelength).

Next, the $Si_{80}Ge_{20}$ film on the strained Si film was removed using a mixture of hydrofluoric acid, oxygenated water, and acetic acid as etching liquid (25° C. liquid temperature), thereby forming a semiconductor substrate having a strained Si film. The peak position of this strained Si film measured by a Raman spectrometer was 516 cm$^{-1}$, and the Raman shift was 4 cm$^{-1}$. Thereby, it was determined that a tensile stress of approximately 1 GPa was induced in the strained Si film.

The depth profile of the Ge content of the strained Si film of the semiconductor substrate according to Example 1 thus obtained was measured by SIMS. Further, for comparison, a semiconductor substrate of Comparative Example 1 was formed in the same process as the semiconductor substrate according to Example 1 except that there was no exposure to an excimer laser. The depth profile of the Ge content was also measured with respect to the Si film of the semiconductor substrate of Comparative Example 1 by SIMS.

Figure 6:
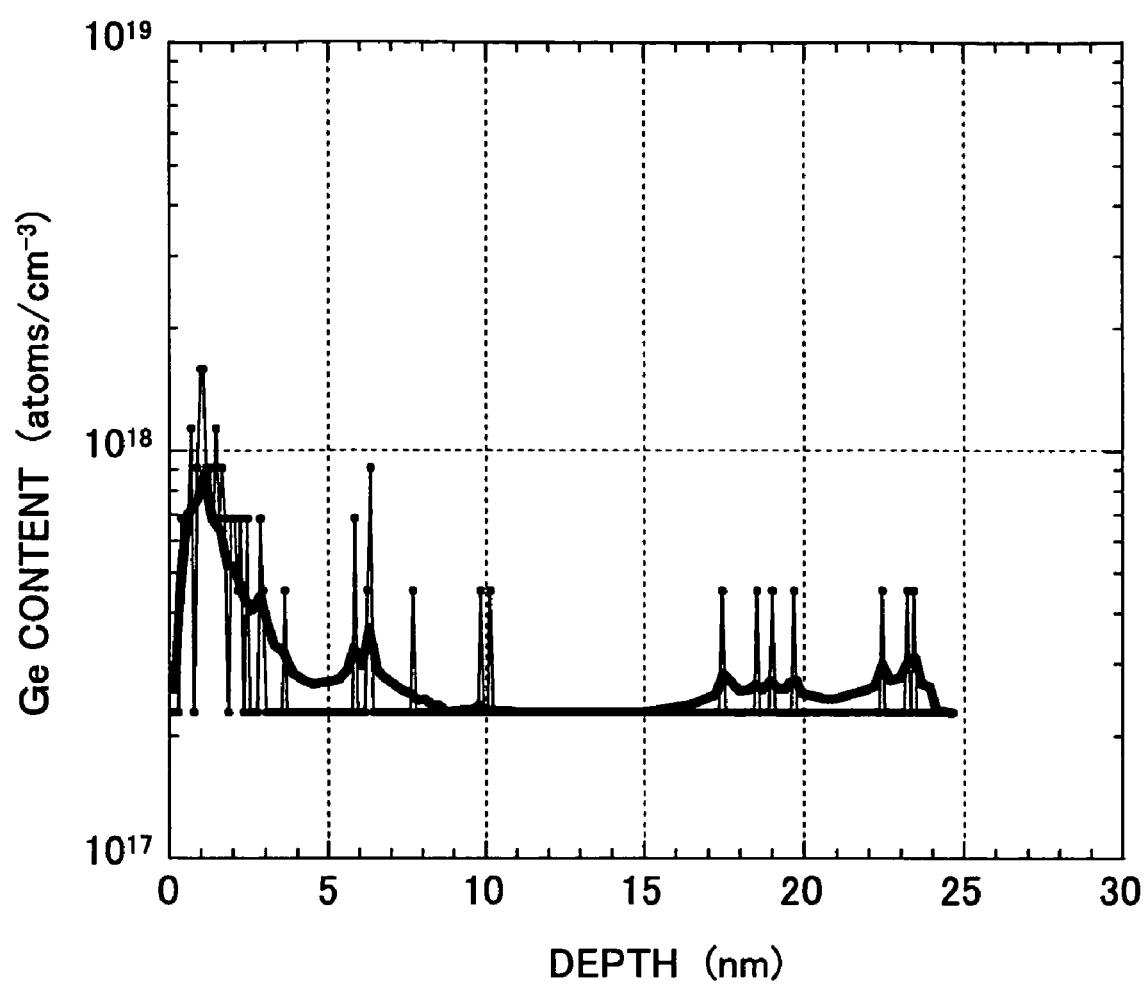
FIG. 6 is a graph showing the depth profile of the Ge content of the strained Si film of a semiconductor substrate according to Example 1 of the first embodiment of the present invention.
Figure 7:
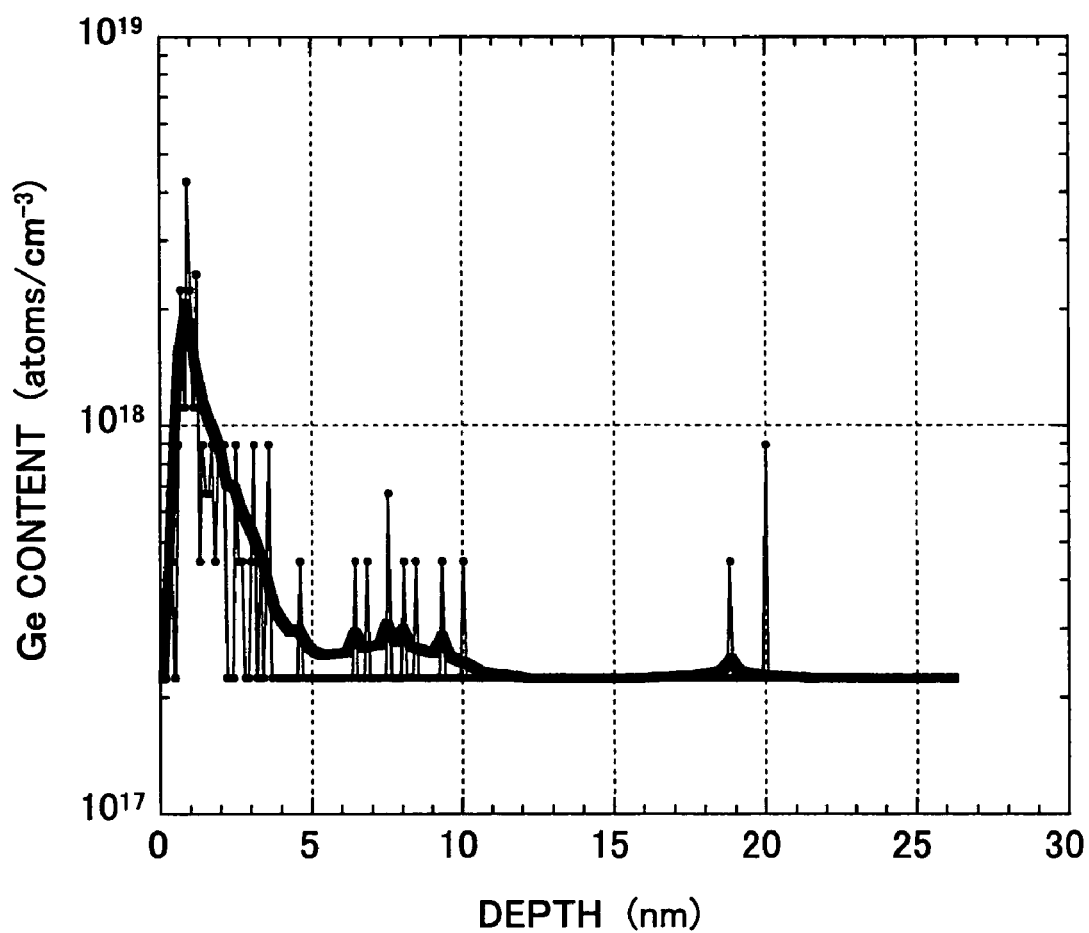
FIG. 7 is a graph showing the depth profile of the Ge content of the Si film of a semiconductor substrate according to Comparative Example 1 according to the first embodiment of the present invention.
Figure 8:
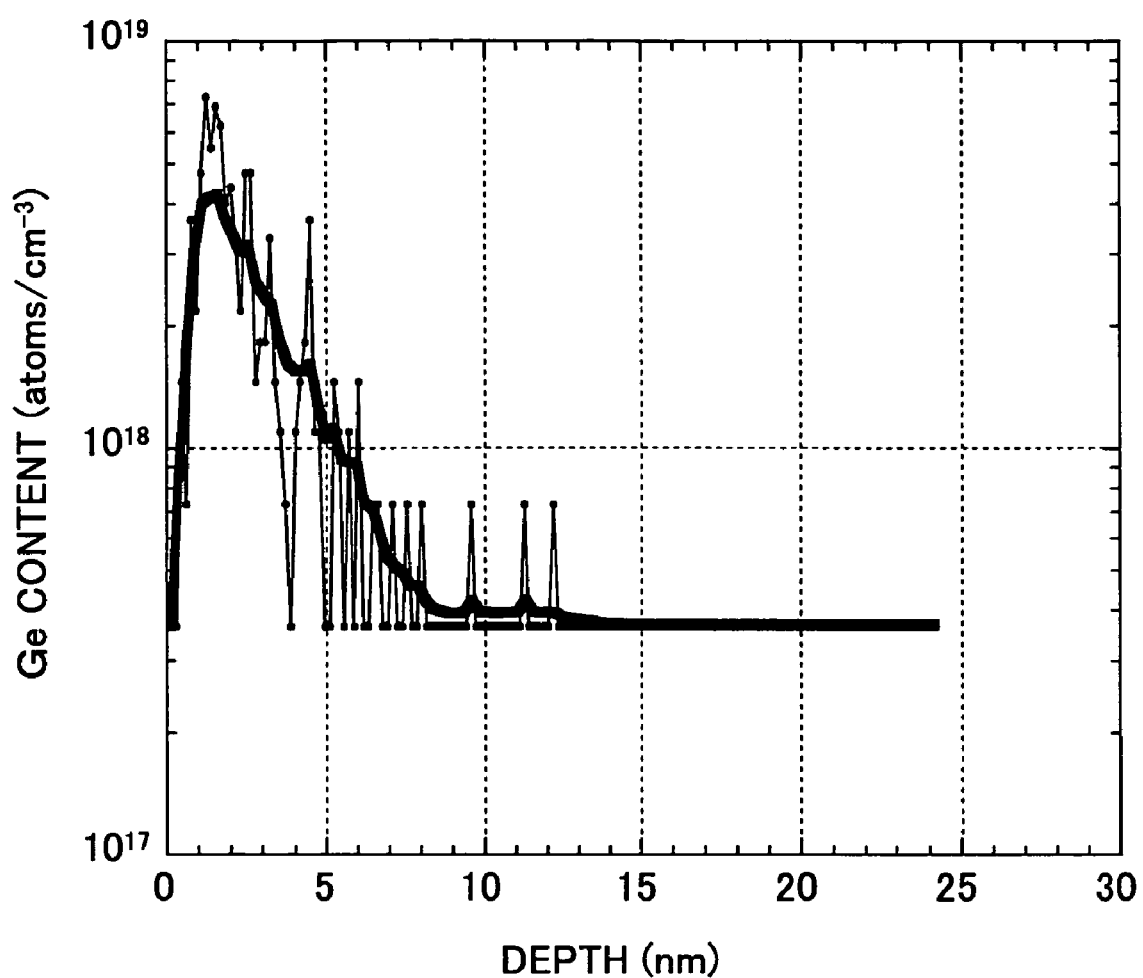
FIG. 8 is a graph showing the depth profile of the Ge content of the strained Si film of a semiconductor substrate according to Comparative Example 2 according to the first embodiment of the present invention.

FIG. 6 is a graph showing the depth profile of the Ge content of the strained Si film of the semiconductor substrate according to Example 1 of the first embodiment. FIG. 7 is a graph showing the depth profile of the Ge content of the Si film of the semiconductor substrate according to Comparative Example 1. In FIGS. 6 and 7, the dots connected by the thin solid line indicate actual measurements of the Ge content, and the thick solid line indicates the moving averages of the actual measurements of the Ge content in the depth direction. Further, in FIGS. 6 and 7, it is because the dots of actual measurements are successive that the Ge content is shown as a solid line at approximately $2.1 \times 10^{17}$ atoms/cm$^{-3}$. The moving averages of the Ge content in the depth direction were determined using a software product (KaleidaGraph, Japanese version, ver. 3.52) of Synergy Software and subjecting the actual measurements of the Ge content to its smoothing function. The absolute values of the Ge content were corrected with a reference sample. In the case of FIG. 8 described below, the SIMS measurement, the method of moving averages, and the correction method were implemented in the same manner.

Referring to FIGS. 6 and 7, comparison of Example 1 and Comparative Example 1 shows that the Ge content is substantially the same from the surface of the Si film to the depth of 25 nm. This shows that exposing the $Si_{80}Ge_{20}$ film to the excimer laser does not cause depthwise (depth-directional) diffusion of Ge atoms in the strained Si film of the semiconductor substrate according to Example 1, and that no diffusion to increase the Ge atom content occurs at any depth. Accordingly, it has been confirmed that it is possible to relax the compressive strain of the $Si_{80}Ge_{20}$ film by exposure to an excimer laser and form tensile strain in the Si film without diffusion of Ge atoms in the Si film.

Next, a depth profile was measured by SIMS with respect to a semiconductor substrate of Comparative Example 2 that was not according to the present invention. The semiconductor substrate of Comparative Example 2 is an SOI substrate having a strained Si film manufactured by Soitec, and has the same configuration as the semiconductor substrate according to Example 1. The semiconductor substrate of Comparative Example 2 was formed by the method of Non-Patent Document 3 or 4 described above in the section of BACKGROUND OF THE INVENTION in this specification.

FIG. 8 is a graph showing the depth profile of the Ge content of the strained Si film of the semiconductor substrate according to Comparative Example 2. In FIG. 8, the thin solid line indicates actual measurements of the Ge content, and the thick solid line indicates the depthwise moving averages of the Ge content.

Referring to FIG. 8, the maximum value of the Ge content of the strained Si film of Comparative Example 2 is $7 \times 10^{18}$ atoms/cm$^{-3}$. On the other hand, the maximum value of the Ge content of the strained Si film of Example 1 shown in FIG. 6 is $1.6 \times 10^{18}$ atoms/cm$^{-3}$. Accordingly, the maximum value of the Ge content of Example 1 is reduced by 75% compared with that of Comparative Example 2, thus showing that the Ge content is low in Example 1.

Here, as indicated by the respective thick solid lines in FIGS. 6 and 8, the maximum value of the depthwise moving averages of the Ge content is approximately $4.1 \times 10^{18}$ atoms/cm$^{-3}$ in Comparative Example 2, while it is $9 \times 10^{17}$ atoms/cm$^{-3}$ in Example 1. This shows that the Ge content of Example 1 is reduced to a quarter of that of Comparative Example 2. As a result, according to Example 1, since the Ge content of the strained Si film of Example 1 is extremely lower than that of the conventional SOI substrate having a strained Si film formed by sticking according to Comparative Example 2, it is possible to avoid formation of the interface state in the case of using the strained Si film as a channel, and it is possible to avoid degradation of film quality even in the case of exposure to an oxygen atmosphere.

Further, as shown in FIGS. 6 and 8, the depth at which the actual measurement of the Ge content is less than or equal to $2 \times 10^{18}$ atoms/cm$^{-3}$ is 4 nm in Comparative Example 2, while it is less than 2 nm in Example 1. This shows that Ge atoms enter only an extremely shallow region in Example 1 compared with Comparative Example 2. In the case of forming a semiconductor device by forming a channel and a shallow junction region in the strained Si film, the technique of reducing the vertical size is employed in order to improve operating speed. In such a case, the semiconductor substrate of Example 1 can reduce the degree of adverse effects exerted by Ge atoms compared with Comparative Example 2 even if a channel and a shallow junction region are formed in a shallow region because Ge atoms enter only an extremely shallow region of the strained Si film.

One reason for employing $2 \times 10^{18}$ atoms/cm$^{-3}$ as a boundary is that if the boundary is lower than this content value, the influence due to measurement errors included in actual measurements resulting from a SIMS apparatus increases so as to increase variations in the individual actual measurements.

Further, the depth profile by SIMS was measured by employing Cs (cesium) as primary ions for irradiation (exposure) and sputtering Cs accelerated to 20 kV onto the surface of a detection area of 180 μm×288 μm in size, using an ADEPT-1010 of Physical Electronics.

According to this embodiment, strain is induced in the Si film 13a by brief heating of the SiGe film 14a with energy lines. Therefore, diffusion of Ge atoms into the strained Si film 13b from the SiGe film 14a is suppressed. Accordingly, it is possible to significantly reduce residual Ge atoms in the strained Si film 13b. As a result, it is possible to realize the semiconductor substrate 10 having a high-quality strained Si film 13b of an extremely low Ge content.

Further, according to this embodiment, an easy heating method employing exposure using energy lines of laser light, a flash lamp, or an electron beam is used. Accordingly, it is possible to manufacture the semiconductor substrate 10 in a simplified manner.

Further, in place of the above-described SiGe film 14a, a material having a greater lattice constant than SiGe, such as AlAs, GaAs, or InP, may be employed. Alternatively, the above-described SiGe film 14a may be replaced by a film having a composition where an element having a large covalent radius is substituted for part of the elements forming a compound of a group III element and a group V element having substantially the same lattice constant as Si, such as GaP or AlP. By using these materials greater in lattice constant than SiGe, the same effects as in the case of using the SiGe film are produced. For example, a GaPAs film formed by substituting As for part of P of GaP, a GaInP film formed by substituting In for part of Ga of GaP, and an AlInP film formed by substituting In for part of Al of AlP may be employed.

Further, it is possible to induce compressive strain in the Si film 13a by causing a film having a smaller lattice constant than Si to grow on the Si film 13a in place of the above-described SiGe film 14a and applying compressive stress to the Si film 13a by the above-described heating method. The compressive strain-induced Si film has a higher hole mobility than a Si film in which no strain is induced. By using such a compressively strained Si film for the channel layer of a p-type MOS transistor, it is possible to increase operating speed. As such a film applying compressive stress to the Si film, a SiC film formed by substituting C for part of Si of a Si film or a film having a composition where an element having a large covalent radius is substituted for part of the elements forming a compound of a group III element and a group V element having substantially the same lattice constant as Si, such as GaP or AlP, may be employed. For example, a GaPN film formed by substituting N for part of P of GaP, a GaAlP film formed by substituting Al for part of Ga of GaP, and AlPN film formed by substituting N for part of P of AlP may be employed. Further, a C film, a BN film, a BP film, and a ZnS film are expected to be also employable as films applying compressive stress to the Si film.

Second Embodiment

Next, a description is given of a semiconductor substrate and a method of manufacturing the same according to a second embodiment of the present invention. The semiconductor substrate according to the second embodiment is a variation of the semiconductor substrate according to the first embodiment.

Figure 9:
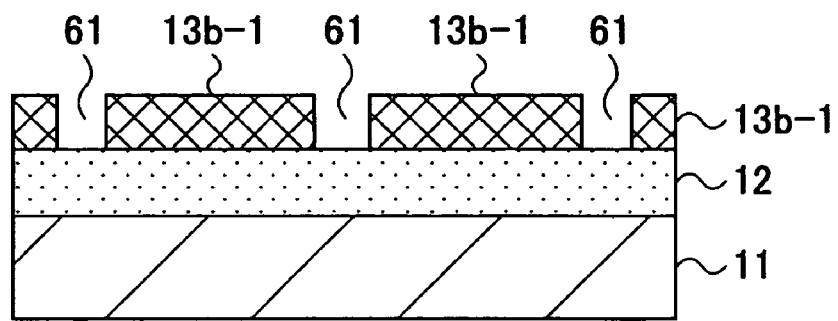
FIG. 9 is a cross-sectional view of a semiconductor substrate according to a second embodiment of the present invention.

FIG. 9 is a cross-sectional view of a semiconductor substrate 60 according to the second embodiment of the present invention. In FIG. 9 and subsequent drawings, the same elements as those described above are referred to by the same numerals, and a description thereof is omitted. Referring to FIG. 9, the semiconductor substrate 60 includes the single-crystal silicon substrate 11, the silicon oxide film 12 stacked thereon, and strained Si films 13b-1 provided separately in multiple regions on the silicon oxide film 12. The strained Si films 13b-1, in which tensile strain is induced in the in-plane direction, are the same as the strained Si film 13b of the first embodiment. The strained Si films 13b-1 are separated from one another by grooves 61 exposing the silicon oxide film 12. A large number of strained Si films 13b-1 are formed on the single substrate. Since the strained Si films 13b-1 are separated from one another by the grooves 61, there is no interference when their respective strains are formed, so that strain has good uniformity in amount in the in-plane direction. Therefore, according to this embodiment, the strained Si films 13b-1 are better in electron mobility and in uniformity.

Each of the strained Si films 13b-1 separated from one another by the grooves 61 may be the size of a single chip of a semiconductor device to be formed on the strained Si film 13b-1. Alternatively, each of the strained Si films 13b-1 may be the size of one of the multiple functional parts of a semiconductor device or the size of a single element.

Figure 10A:
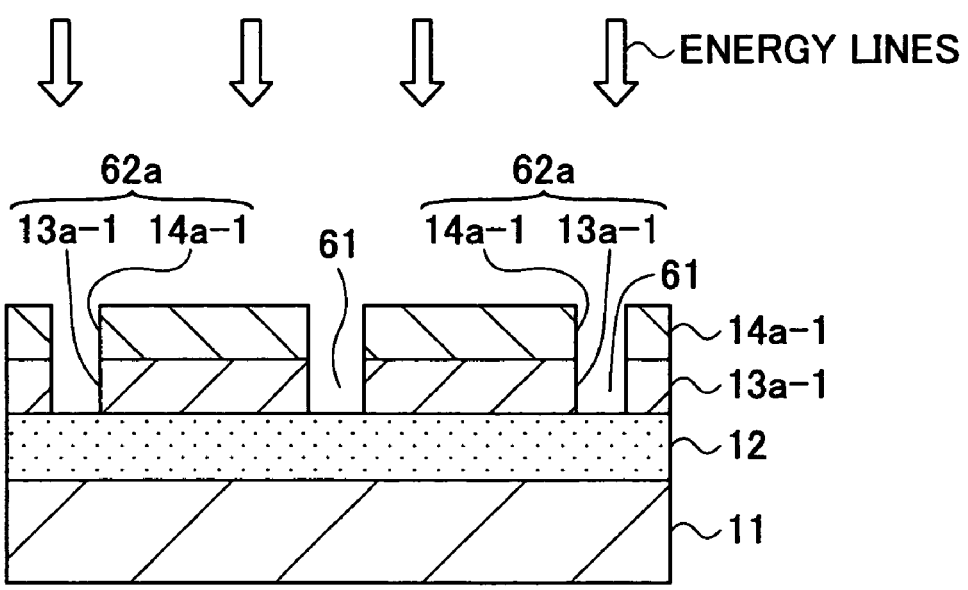
FIGS. 10A and 10B are diagrams showing part of a process for manufacturing a semiconductor substrate according to the second embodiment of the present invention.
Figure 10B:
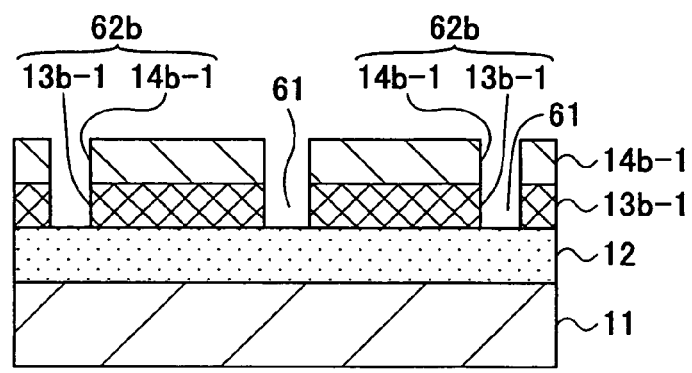
Figure 11:
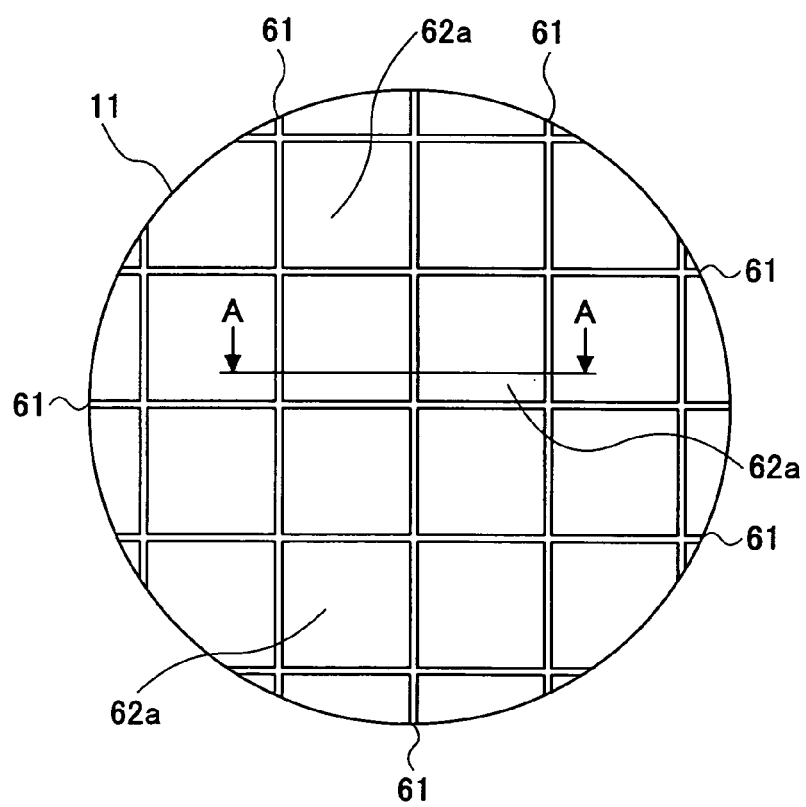
FIG. 11 is a plan view of the semiconductor substrate in the process of FIG. 10A according to the second embodiment of the present invention.

FIGS. 10A and 10B are diagrams showing part of a process for manufacturing a semiconductor substrate according to the second embodiment. FIG. 11 is a plan view of the semiconductor substrate in the process of FIG. 10A.

First, the silicon oxide film 12, the Si film 13a, and the SiGe film 14a are stacked on the single-crystal silicon substrate 11 in the same manner as in the processes of FIGS. 2A and 2B of the first embodiment.

Next, in the process of FIG. 10A, the grooves 61 passing through the SiGe film 14a and the Si film 13a so as to expose the silicon oxide film 12 are formed. Specifically, as also shown in FIG. 11, the grooves 61 are formed on the substrate surface in a matrix-like manner so as to divide the SiGe film 14a and the Si film 13a in multiple regions, thereby forming layered bodies 62a each formed of a corresponding Si film 13a-1 and SiGe film 14a-1. The grooves 61 are formed by, for example, photolithography and RIE. The cross-sectional view of FIG. 10A is taken along the line A-A of FIG. 11.

Further, in the process of FIG. 10B, the surfaces of the SiGe films 14a-1 are exposed to energy lines. Exposure to the energy lines is performed in the same manner as in FIG. 2C. As a result, by the same action as in the process of FIG. 2C, the compressive strain of the SiGe films 14a-1 is relaxed so that tensile strain is induced in the Si films 13a-1. Consequently, Si films 13b-1 in which tensile strain is induced as shown in FIG. 10B are formed. Layered bodies 62b each formed of the corresponding Si film 13b-1 and SiGe film 14b-1 are separated by the grooves 61, so that the ends of each of the Si films 13b-1 and the SiGe films 14b-1 are open. This smoothes relaxation of the compressive strain of each SiGe film 14b-1 and induction of the tensile strain of each Si film 13b-1. As a result, the uniformity of the tensile strain of each Si film 13b-1 in the in-plane direction is good, and the uniformity of the electron mobility of each Si film 13b-1 is good. Further, substantially all the amount of relaxed compressive strain of each SiGe film 14a-1 of FIG. 10A becomes the amount of tensile strain of the corresponding Si film 13b-1. Accordingly, a greater amount of tensile strain is induced in the strained Si film 13b-1 than in the first embodiment. Further, at the time of exposure to energy lines, the surface of the silicon oxide film 12 exposed at the bottom surfaces of the grooves 61 is exposed to the energy lines. As a result, the temperature of the silicon oxide film 12 rises, so that the joining of the Si films 13a-1 and the silicon oxide film 12 shown in FIG. 10A is likely to be broken. Consequently, a greater tensile strain is likely to be formed in each Si film 13b-1.

The layered bodies 62a shown in FIGS. 10A and 11 may be exposed to energy lines one by one. The area of each layered body 62a is smaller than the area of the entire substrate 11, and it is easier to form energy lines of uniform energy density for such a small-area region. As a result, the amount of tensile strain of the Si film 13b-1 of each layered body 62b has better uniformity. Further, it is more effective to emit energy lines onto an area greater than each layered body 62a.

The in-plane-directional size of each of the layered bodies 62a separated by the grooves 61 is suitably determined. Each layered body 62a may be equal in size to a semiconductor device such as a memory chip or an LSI. Alternatively, each layered body 62a may be approximately an integral multiple of a semiconductor device in size. This facilitates a dicing process for cutting the semiconductor substrate 60 into individual semiconductor devices after forming the semiconductor devices thereon in a semiconductor device manufacturing process.

Next, the SiGe films 14b-1 are removed in the same manner as in the above-described process of FIG. 2E, of which graphical illustration is omitted. Thereby, the semiconductor substrate 60 shown in FIG. 9, having the strained Si films 13b-1 separated from one another in the in-plane direction, is formed.

According to this manufacturing method, the grooves 61 are formed in the layered body of the Si film 13a and the SiGe film 14a in the process of FIG. 10A. Alternatively, although not graphically illustrated, grooves may be formed in the same manner as in the process of FIG. 10A after forming the Si film 13a, and then the SiGe films 14a-1 may be formed on the Si films 13a-1.

According to this embodiment, the same effects as those of the semiconductor substrate manufacturing method according to the first embodiment are produced. In addition, since the amount of tensile strain is uniform over the entire strained Si film 13b-1, the strained Si film 13b-1 with higher quality can be obtained.

Third Embodiment

A third embodiment of the present invention relates to a semiconductor substrate having a strained Si film in which tensile strain is induced in a crystal lattice and to a method of manufacturing the same. The third embodiment is equal to the first embodiment except that multiple SiGe films of different compositions are employed in place of a single-layer SiGe film.

Figure 12A:
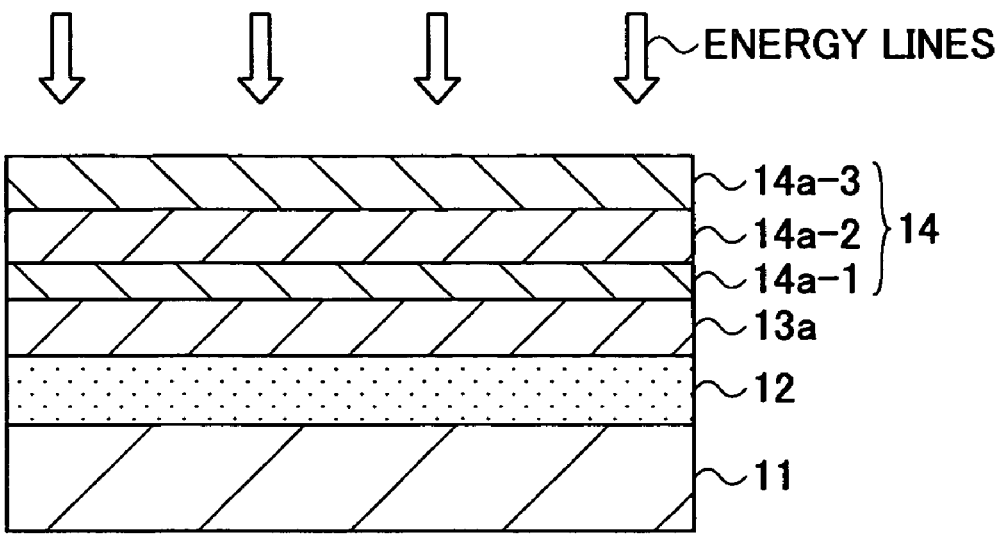
FIGS. 12A and 12B are diagrams showing a process for manufacturing a semiconductor substrate according to a third embodiment of the present invention.
Figure 12B:
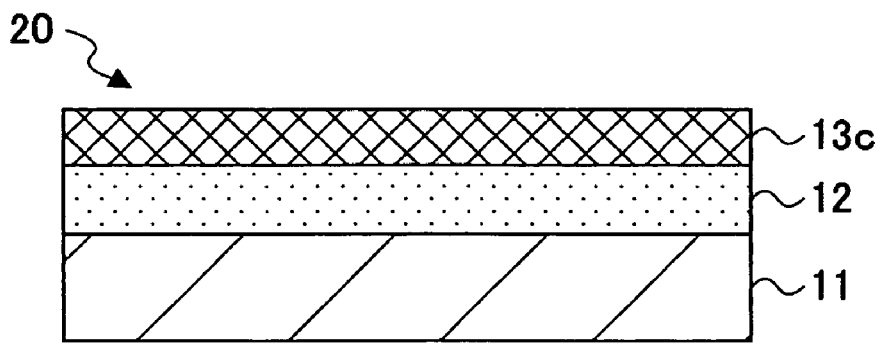

FIGS. 12A and 12B are diagrams showing a process for manufacturing a semiconductor substrate according to the third embodiment of the present invention. In the drawings, the parts corresponding to those described above are referred to by the same numerals, and a description thereof is omitted.

First, in the process of FIG. 12A, a layered body of the single-crystal silicon substrate 11, the silicon oxide film 12, and the Si film 13a is formed in the same manner as in the process of FIG. 2A of the first embodiment.

Further, in the process of FIG. 12A, a layered body of multiple SiGe films 14a-1, 14a-2, and 14a-3 having different Ge concentrations is formed on the Si film 13a. The SiGe films 14a-1 through 14a-3 are formed in the same manner as in the process of FIG. 2B of the first embodiment.

The compositions of the SiGe films 14a-1 through 14a-3 are determined so that the Ge concentration gradually decreases in the stacking direction from the Si film 13a side. For example, referring to FIG. 12A, the SiGe films 14a-1 through 14a-3 are a $Si_{60}Ge_{40}$ film (5 nm in thickness), a $Si_{80}Ge_{20}$ film (20 nm in thickness), and a $Si_{90}Ge_{10}$ film (20 nm in thickness), respectively, from the Si film 13a side. By thus configuring the layered body of the SiGe films 14a-1 through 14a-3, a greater tensile strain can be induced in the Si film 13a at the interface therewith by the $Si_{60}Ge_{40}$ film 14a-1 having a high Ge concentration. In addition, by forming a layered body suppressing the occurrence of a defect therein, ensuring thickness, and having good crystallinity by successively stacking the $Si_{80}Ge_{20}$ film 14a-2 and the $Si_{90}Ge_{10}$ film 14a-3 both smaller in lattice constant than the $Si_{60}Ge_{40}$ film in the stacking direction of the layered body, it is possible to support the $Si_{60}Ge_{40}$ film 14a-1 and to stably induce tensile strain in the Si film 13a.

Further, the shorter the wavelength of laser light, the higher the absorbance of the $Si_{90}Ge_{10}$ film 14a-3 of a low Ge concentration disposed at the surface of the layered body of the SiGe films 14a-1 through 14a-3, so that the $Si_{90}Ge_{10}$ film 14a-3 can convert the light energy of laser light into heat with efficiency. That is, the layered body of the SiGe films 14a-1 through 14a-3 may have a composition that induces a greater strain on the Si film 13a side and have a composition that causes the absorbance of laser light to be high on the layered body surface side. The number of layers of the layered body is not limited to three, and may be two or more than three. Further, the layered body of the SiGe films 14a-1 through 14a-3 may be a composition gradient film in which the Ge concentration changes continuously.

Further, in the process of FIG. 12A, the surface of the layered body of the SiGe films 14a-1 through 14a-3 is exposed to laser light in the same manner as in the process of FIG. 2C. This induces tensile strain in the Si film 13a, so that a strained Si film 13c shown in FIG. 12B is formed. Although not graphically illustrated, the compressive strain of the layered body of the SiGe films 14a-1 through 14a-3 is relaxed by laser exposure.

Next, in the process of FIG. 12B, the layered body of the SiGe films 14a-1 through 14a-3 shown in FIG. 12A is removed in the same manner as in the process of FIG. 2E. Thereby, a semiconductor substrate 20 having the Si film 13c in which tensile strain is induced can be formed.

According to this embodiment, multiple SiGe films are stacked on a Si film so that the Ge concentration in the SiGe films decreases in the direction away from the interface with the Si film. By thus forming a SiGe film layered body suppressing the occurrence of a defect therein, ensuring thickness, and having good crystallinity, it is possible to support the $Si_{60}Ge_{40}$ film 14a-1 and to stably induce tensile strain in the Si film 13a. Accordingly, it is possible to form the semiconductor substrate 20 having the Si film 13c having a greater tensile strain induced than the semiconductor substrate 10 formed in the first embodiment.

Fourth Embodiment

Next, a description is given of a semiconductor substrate and a method of manufacturing the same according to a fourth embodiment of the present invention. The semiconductor substrate according to the fourth embodiment is formed by forming a Ge film on the surface of the strained Si film 13c of the semiconductor substrate 20 according to the third embodiment.

Figure 13:
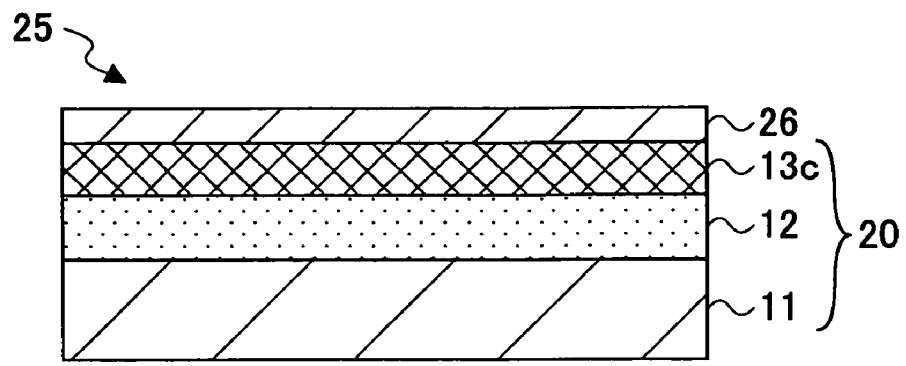
FIG. 13 is a cross-sectional view of a semiconductor substrate according to a fourth embodiment of the present invention.

FIG. 13 is a cross-sectional view of a semiconductor substrate 25 according to the fourth embodiment of the present invention. In FIG. 13, the parts corresponding to those described above are referred to by the same numerals, and a description thereof is omitted.

Referring to FIG. 13, the semiconductor substrate 25 includes the semiconductor substrate 20 formed of the single-crystal silicon substrate 11, the silicon oxide film 12, and the strained Si film 13c; and a Ge film 26 formed on the surface of the strained Si film 13c. The semiconductor substrate 20 has the same configuration and is formed in the same manner as the semiconductor substrate 20 shown in FIG. 12B according to the third embodiment.

The Ge film 26 is formed on the strained Si film 13c by CVD such as ultrahigh vacuum CVD, hydrogen reduction, thermal decomposition, or MOCVD. A Ge crystal is approximately 4.2% greater in lattice constant than a Si crystal. However, since tensile strain is caused in the strained Si film 13c by the SiGe film 14a-1 of a high Ge concentration of the third embodiment, the Ge film 26 is prevented from having dislocation at the interface, and forms a coherent interface to grow epitaxially. Specifically, formation of the Ge film 26 is performed for 30 minutes, using $GeH_4$ (flow rate of 7 sccm) as a source gas of Ge and $H_2$ (flow rate of 1 sccm) as a carrier gas, at a pressure of $10^{-4}$ Pa and at a substrate temperature of 350° C. Further, the Ge film 26 is within the range of 1 nm to 10 nm in thickness.

Since hole mobility and electron mobility are several times greater in the Ge film 26 than in the Si film, it is possible to form a high-speed transistor with the semiconductor substrate 25 having the Ge film 26, using the Ge film 26 as a channel layer.

Further, the Ge film 26, better in quality than a Ge film formed on a normal Si film, can be formed on the semiconductor substrate 25. Further, the strained Si film 13c may have such thickness as to allow the Ge film 26 to grow epitaxially thereon. For example, the strained Si film 13c may be 1 nm to 5 nm in thickness. Thus, the strained Si film 13c can be reduced in thickness. Therefore, the strained Si film 13c with better quality can be used, so that it is possible to form the Ge film 26 with good quality.

The semiconductor substrate 25 according to this embodiment is formed using the semiconductor substrate 20 formed of the single-crystal silicon substrate 11, the silicon oxide film 12, and the strained Si film 13 of the third embodiment. Alternatively, the semiconductor substrate 10 of the first embodiment or the semiconductor substrate 60 of the second embodiment may be used, and a Ge film may be formed on the strained Si film 13b or each strained Si film 13b-1.

Fifth Embodiment

Next, a description is given of a semiconductor substrate and a method of manufacturing the same according to a fifth embodiment of the present invention.

Figure 14:
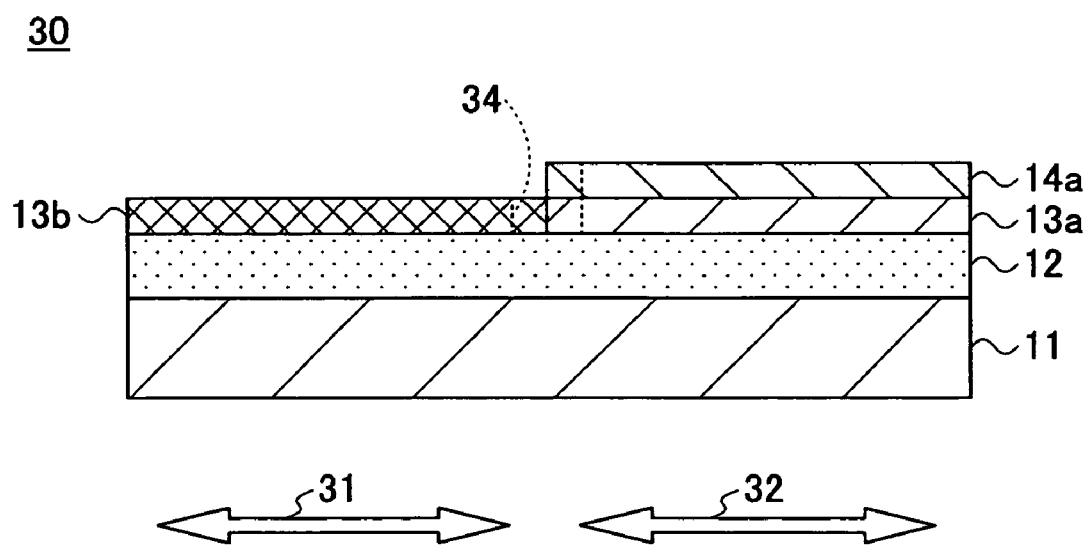
FIG. 14 is a cross-sectional view of a semiconductor substrate according to a fifth embodiment of the present invention.

FIG. 14 is a cross-sectional view of a semiconductor substrate 30 according to the fifth embodiment of the present invention. Referring to FIG. 14, the semiconductor substrate 30 includes the single-crystal silicon substrate 11, the silicon oxide film 12, and a first region 31 and a second region 32 on the silicon oxide film 12. The first region 31 includes the Si film 13b in which tensile strain is induced in a crystal lattice in the directions parallel to the substrate surface. The second region 32 includes the SiGe film 14a in which compressive strain is induced in a crystal lattice in the directions parallel to the substrate surface. The Si film 13b of the first region 31 is the same as the strained Si films of the above-described first through third embodiments. The SiGe film 14a of the second region 32 has a zinc blende crystal structure, and has a (001) plane formed parallel to the substrate surface. Further, the [001] direction is its film thickness direction. Tensile strain is induced in the SiGe film 14a in its film thickness direction. Further, compressive strain is induced in the SiGe film 14a in the directions parallel to the substrate surface, that is, in the moving directions of holes, thus resulting in better hole mobility.

Figure 15A:
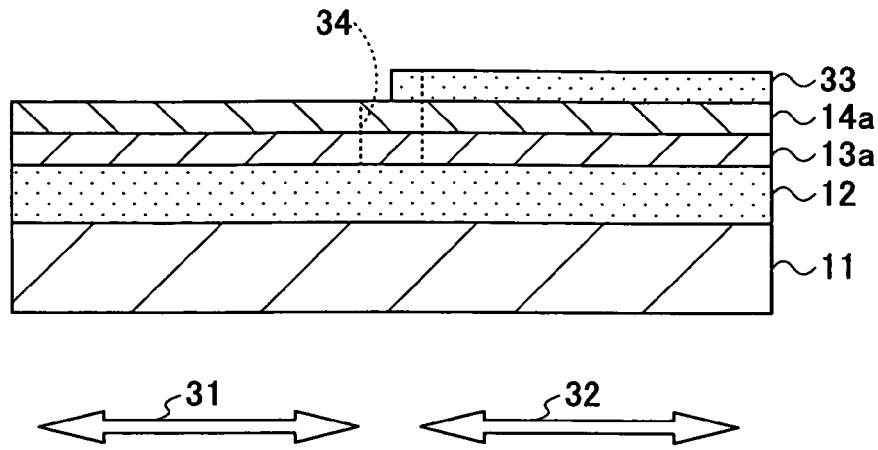
FIGS. 15A through 15C are diagrams showing a process for manufacturing a semiconductor substrate according to the fifth embodiment of the present invention.
Figure 15B:
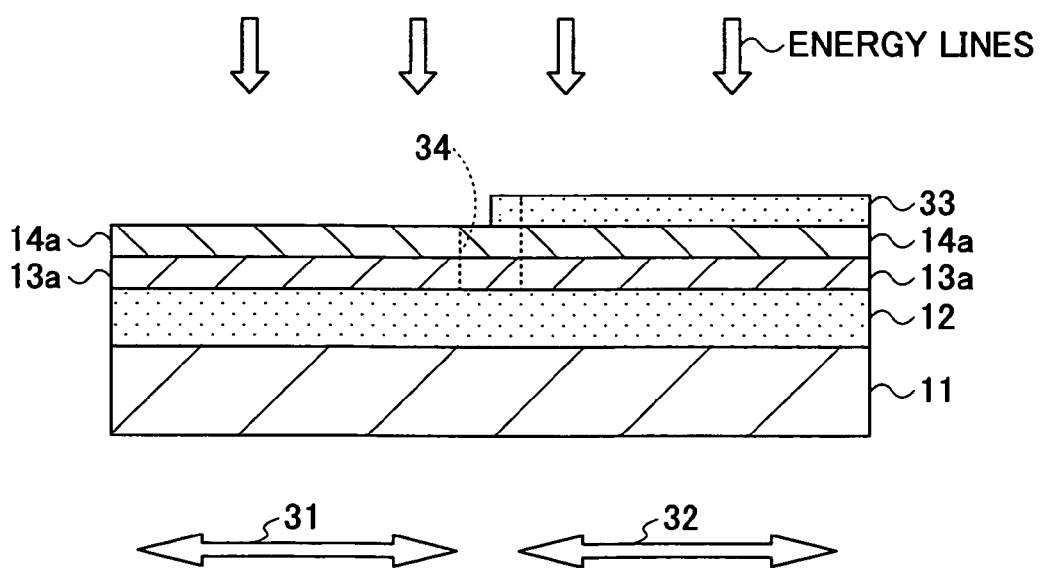
Figure 15C:
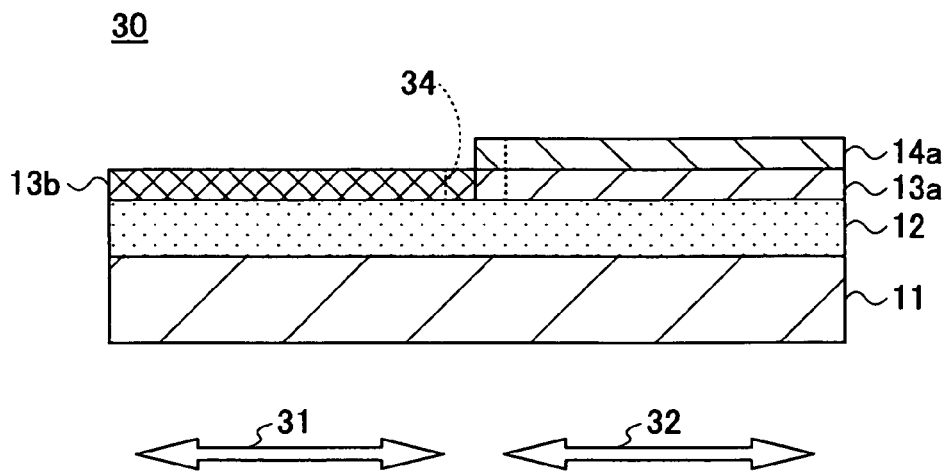

FIGS. 15A through 15C are diagrams showing a process for manufacturing a semiconductor substrate according to the fifth embodiment of the present invention. In the drawings, the parts corresponding to those described above are referred to by the same numerals, and a description thereof is omitted.

First, in the process of FIG. 15A, the layered body of single-crystal silicon substrate 11/silicon oxide film 12/Si film 13a is formed in the same manner as in the process of FIG. 2A of the first embodiment.

Further, in the process of FIG. 15A, the SiGe film 14a is formed in the same manner as in the process of FIG. 2B. As described above, since the SiGe film 14a has grown epitaxially on the Si film 13a, compressive strain is induced therein.

Further, in the process of FIG. 15A, a resist film (not graphically illustrated; 100 nm in thickness) is formed by photolithography selectively on the SiGe film 14a of the first region 31 to cause tensile strain to be induced in the Si film 13a in the next process, and a silicon oxide film 33 is further formed by sputtering or CVD. The silicon oxide film 33 is approximately 50 nm in thickness if the surface of the silicon oxide film 33 is heated in the next process. Then, the resist film is lifted off along with the silicon oxide film 33 thereon. A groove part 34 reaching the lower silicon oxide film 12 may be provided at the boundary part between the first region 31 and the second region 32. Specifically, although not graphically illustrated, a resist film is selectively formed by photolithography, and the groove part 34 is formed by dry etching such as RIE. By causing the Si film 13a to be discontinuous between the first region 31 and the second region 32 by providing the groove part 34 as described above, it is possible to induce tensile strain uniformly in the Si film 13a only in the first region 31 in the next process.

In the process of FIG. 15B, the surface of the structure of FIG. 15A is exposed to laser light. The exposure to laser light is performed in the same manner as in the process of FIG. 2C of the first embodiment. By this exposure to laser light, tensile stress is applied to the Si film 13a by the SiGe film 14a in the first region 31, so that tensile strain is induced in the Si film 13a in the first region 31. The power of the heat by the laser exposure to enter the SiGe film 14a in the second region 32 is halved by light interference because of the silicon oxide film 33. Therefore, the compressive strain remains induced in the SiGe film 14a in the second region 32. The heating methods using exposure to other energy lines described in the process of FIG. 2C may be employed.

It is also possible to selectively expose only the SiGe film 14a in the first region 31 to laser light without forming the silicon oxide film 33. The selective laser exposure may be performed by using a galvano scanner or a polygon mirror as described above, or by providing a mask to restrict the spread of a predetermined laser light beam in accordance with an area to be illuminated between a laser light source and an illumination optical system.

In the process of FIG. 15C, the SiGe film 14a in the first region 31, in which strain has been relaxed by the laser exposure, is removed in the same manner as in the process of FIG. 2E of the first embodiment. Then, the silicon oxide film 33 in the second region 32 is removed by etching (chemical processing). Thereby, the strained semiconductor substrate 30, having on the silicon oxide film 12 the first region 31 including the Si film 13b in which tensile strain is induced, and the second region 32 including the SiGe film 14a in which compressive strain is induced, is formed.

According to this embodiment, it is possible to manufacture a semiconductor substrate having the strained Si film 13b having high electron mobility and the strained SiGe film 14a having high hole mobility by a simplified method. Further, since a Si film of high electron mobility and such a semiconductor substrate can be provided on a single substrate, a CMOS (complementary MOS) transistor that operates at high speed can be formed with ease as described below.

Sixth Embodiment

A sixth embodiment of the present invention relates to a semiconductor device having a CMOS transistor formed on the semiconductor substrate as described in the fifth embodiment, the semiconductor substrate having a Si film in which tensile strain is induced in a crystal lattice and a SiGe film in which compressive strain is induced in a crystal lattice. In the drawings, the parts corresponding to those described above are referred to by the same numerals, and a description thereof is omitted.

Figure 16:
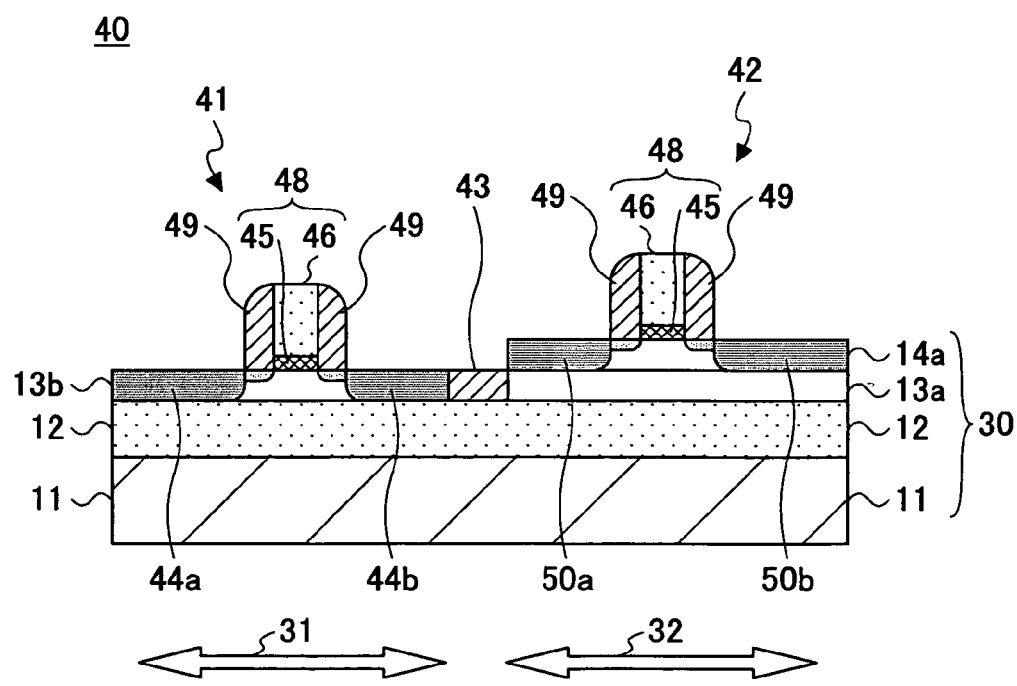
FIG. 16 is a cross-sectional view of a semiconductor device according to a sixth embodiment of the present invention.

FIG. 16 is a cross-sectional view of a semiconductor device 40 according to the sixth embodiment of the present invention. The semiconductor device 40 of this embodiment includes the semiconductor substrate 30 according to the fifth embodiment shown in FIG. 15C, an n-type MOS transistor 41 formed in the first region 31, and a p-type MOS transistor 42 formed in the second region 32. An isolation part 43 is formed between the n-type MOS transistor 41 and the p-type MOS transistor 42.

In the n-type MOS transistor 41, a source region 44a and a drain region 44b in which an n-type impurity is diffused are formed in the strained Si film 13b of the first region 31. A gate layered body 48 of a gate insulating film 45 and a gate electrode 46 stacked thereon is formed on the strained Si film 13b between the source region 44a and the drain region 44b. A sidewall insulating film 49 is formed on each side of the gate layered body 48. A channel (not graphically illustrated) is formed in the strained Si film 13b under the gate insulating film 45. Since tensile strain is induced in the strained Si film 13b, the strained Si film 13b is greater in electron mobility than a Si film in which no strain is induced, thus enabling the n-type MOS transistor 41 to operate at high speed.

On the other hand, in the p-type MOS transistor 42, a source region 50a and a drain region 50b in which a p-type impurity is diffused are formed in the SiGe film 14a of the second region 32 in which compressive strain is induced (hereinafter referred to as "strained SiGe film 14a"). The gate layered body 48 of the gate insulating film 45 and the gate electrode 46, and the sidewall insulating films 49 are formed in the p-type MOS transistor 42 the same as in the n-type MOS transistor 41. Further, a channel is formed in the strained SiGe film 14a under the gate insulating film 45. Since compressive strain is induced in the strained SiGe film 14a, the strained SiGe film 14a is greater in hole mobility than a Si film and a SiGe film in which no strain is induced, thus enabling the p-type MOS transistor 42 to operate at high speed.

Next, a description is given of a method of manufacturing a semiconductor device according to the sixth embodiment.

Figure 17A:
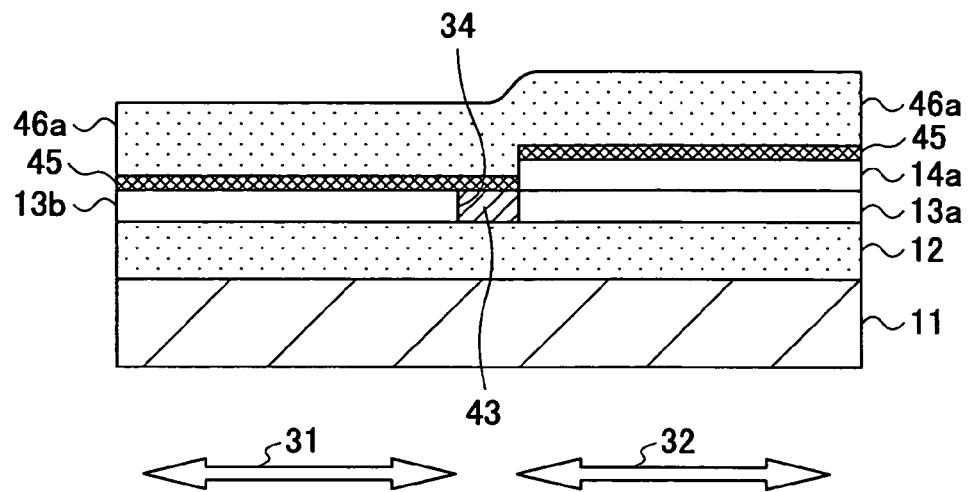
FIGS. 17A through 17C are diagrams showing a process for manufacturing a semiconductor device according to the sixth embodiment of the present invention.
Figure 17B:
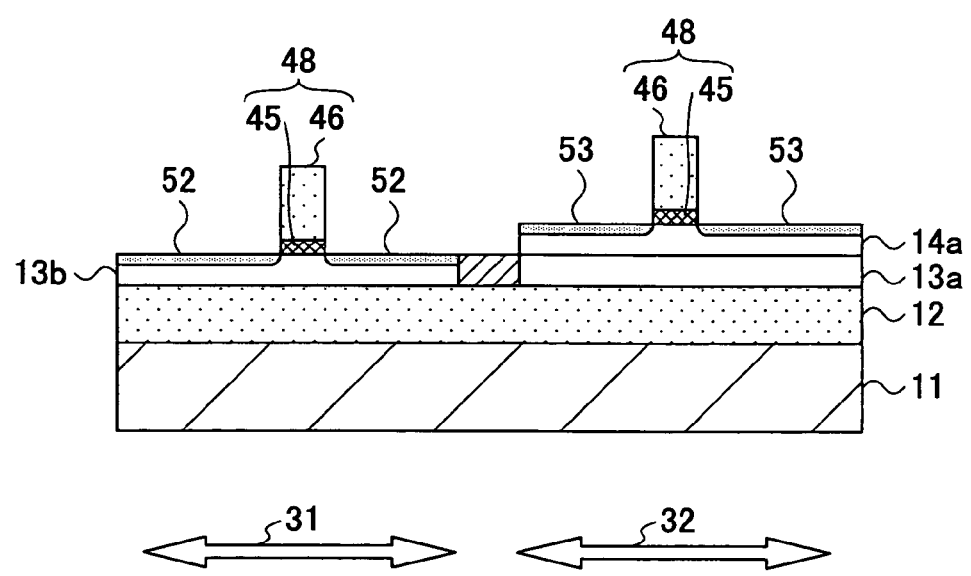
Figure 17C:
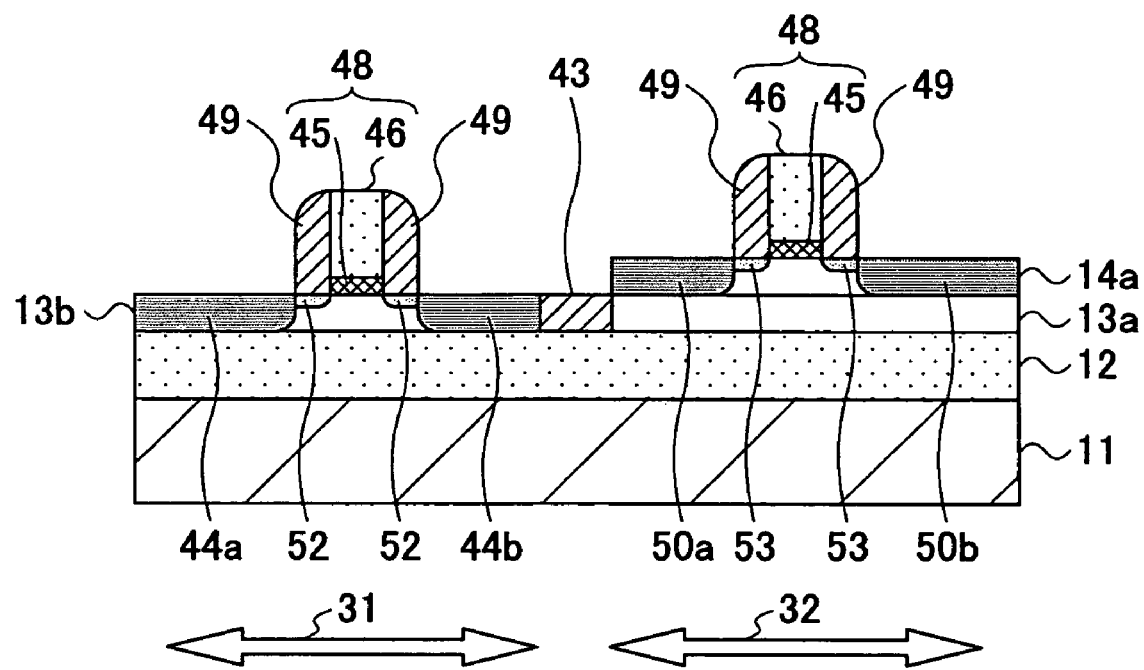

FIGS. 17A through 17C are diagrams showing a process for manufacturing a semiconductor device according to the sixth embodiment. In the drawings, the parts corresponding to those described above are referred to by the same numerals, and a description thereof is omitted.

First, in the process of FIG. 17A, the semiconductor substrate 30 having the strained Si film 13b (first region 31) and the strained SiGe film 14a (second region 32) at its surface is formed in the same manner as in the fifth embodiment. The groove part 34 is formed at the boundary part between the first region 31 and the second region 32. Next, the groove part 34 is filled with an insulating material such as a silicon oxide film or a silicon nitride film, thereby forming the isolation part 43.

Further, in the process of FIG. 17A, the gate insulating film 45 (for example, a silicon oxide film, a silicon oxynitride film, or a metal oxide film of 1 nm to 3 nm in thickness) is formed on the surfaces of the strained Si film 13b, the isolation part 43, and the strained SiGe film 14a by thermal oxidation, CVD, or sputtering. Further, a polysilicon film 46a (100 nm in thickness) to serve as a gate electrode in the next process is formed.

Next, in the process of FIG. 17B, a resist film is formed on the surface of the polysilicon film 46a, and patterning is performed so that only regions to serve as gates remain. Then, using the resist film as a mask, the polysilicon film 46a and the gate insulating film 45 are etched by RIE so as to expose the surfaces of the strained Si film 13b and the strained SiGe film 14a, thereby forming the gate layered bodies 48 each formed of the gate insulating film 45 and the gate electrode 46.

Further, in the process of FIG. 17B, using the resist film and the gate layered bodies 48 as a mask, an n-type impurity and a p-type impurity are implanted into the strained Si film 13b and the strained SiGe film 14a, respectively, thereby forming extension regions 52 and 53. Next, the resist film is removed by ashing using an oxygen plasma.

Next, in the process of FIG. 17C, a silicon oxide film (200 nm in thickness) is formed on the surface of the structure of FIG. 17B, and the sidewall insulating film 49 is formed on each side of each gate layered body 48 by etch back.

Further, in the process of FIG. 17C, activation is performed by implanting an n-type impurity and a p-type impurity into the strained Si film 13b and the strained SiGe film 14a, respectively, using the sidewall insulating films 49 and the gate electrodes 46 as a mask, thereby forming the source regions 44a and 50a and the drain regions 44b and 50b. Thereby, the n-type MOS transistor 41 and the p-type MOS transistor 42 are formed.

Next, although not graphically illustrated, interlayer insulating films, vertical interconnections such as contacts, and interconnection layers are formed by causing silicide formation reaction by a known method. Thereby, the semiconductor device 40 of this embodiment is completed.

According to this embodiment, since the channel of the n-type MOS transistor 41 is formed in the strained Si film 13b of high electron mobility in which tensile strain is induced, the n-type MOS transistor 41 can operate at high speed. Further, since the p-type MOS transistor 42 is formed in the strained SiGe film 14a of high hole mobility in which compressive strain is induced, the p-type MOS transistor 42 can operate at high speed.

Further, since the Ge atom content of the strained Si film 13b of the n-type MOS transistor 41 is extremely reduced, it is possible to suppress formation of the interface state in the channel, and thus to prevent a decrease in electron mobility. Further, there is no possibility of an increase in the sheet resistance of the surfaces of the source region 44a and the drain region 44b converted into silicide due to the effect of Ge atoms. Further, even if the strained Si film 13b is exposed to oxygen plasma employed in ashing for removing a resist film, since the Ge atom content of the strained Si film 13b is extremely reduced, oxidation and vaporization of Ge atoms are suppressed, so that it is possible to suppress degradation of the film quality of the strained Si film 13b.

Although not graphically illustrated, the n-type MOS transistor of this embodiment may be formed on the semiconductor substrate 25 (FIG. 13) according to the fourth embodiment in the same manner. For example, an n-type MOS transistor using the Ge film 26 of the semiconductor substrate 25 according to the fourth embodiment as a channel layer may be formed in the same manner as in this embodiment. This n-type MOS transistor can operate at high speed the same as the n-type MOS transistor 41 of this embodiment. A p-type MOS transistor using the Ge film 26 of the semiconductor substrate 25 of the fourth embodiment as a channel layer may also be formed.

Thus, according to embodiments of the present invention, it is possible to provide a semiconductor substrate having a high-quality strained Si film, and a method of manufacturing the semiconductor substrate in a simplified manner. Further, according to embodiments of the present invention, it is also possible to provide a semiconductor device that can operate at high speed and a method of manufacturing the semiconductor device.

According to one embodiment of the present invention, there is provided a method of manufacturing a semiconductor device, the semiconductor device including a substrate; an insulating film formed on the substrate; a first semiconductor layer in which strain is induced in directions parallel to a surface of the substrate, the first semiconductor layer being on the insulating film; a source region and a drain region formed in the first semiconductor layer; and a gate layered body formed of a gate insulating film and a gate electrode on the first semiconductor layer, the method including the steps of: (a) forming a second semiconductor layer by epitaxial growth on the first semiconductor layer; (b) heating the second semiconductor layer; and (c) removing the second semiconductor layer, wherein the second semiconductor layer is different in lattice constant in an in-plane direction from the first semiconductor layer; and step (b) induces the strain in the first semiconductor layer by exposing a surface of the second semiconductor layer to energy lines.

According to this embodiment, the second semiconductor layer that induces strain is formed on the first semiconductor layer. Then, the surface of the second semiconductor layer is heated by being exposed to energy lines, thereby relaxing the strain in the second semiconductor layer. At this point, since the second semiconductor layer is different in lattice constant in the in-plane direction from the first semiconductor layer, stress is applied to the first semiconductor layer from the second semiconductor layer, so that strain is induced in the first semiconductor layer. As a result, the electron mobility of the strain-induced first semiconductor layer can be improved. Further, since the second semiconductor layer is removed after strain is induced in the first semiconductor layer, it is possible to prevent the atoms of an element forming the second semiconductor layer from diffusing into and remaining in the first semiconductor layer. Consequently, it is possible to realize a semiconductor device having a high-quality, strain-induced semiconductor layer (first semiconductor layer).

According to one embodiment of the present invention, there is provided a method of manufacturing a semiconductor device, the semiconductor device including a substrate; an insulating film formed on the substrate; a first semiconductor layer formed on the insulating film; an n-type MOS transistor formed in a first region of the first semiconductor layer; a second semiconductor layer formed on a second region of the first semiconductor layer; and a p-type MOS transistor formed in the second semiconductor layer, the method including the steps of: (a) forming the second semiconductor layer by epitaxial growth on the first semiconductor layer; (b) heating the second semiconductor layer on the first region of the first semiconductor layer; and (c) removing the second semiconductor layer on the first region of the first semiconductor layer, wherein the second semiconductor layer is greater in lattice constant in an in-plane direction than the first semiconductor layer in a strain-free condition; and step (b) induces tensile strain in the first semiconductor layer by exposing a surface of the second semiconductor layer to energy lines.

According to this embodiment, the second semiconductor layer greater in lattice constant in the in-plane direction than the first semiconductor layer in a strain-free condition is formed on the first semiconductor layer, and the second semiconductor layer on the first region of the first semiconductor layer is heated. As a result, tensile stress is applied to the first semiconductor layer from the second semiconductor layer, so that tensile strain is induced in the first semiconductor layer. Consequently, it is possible to increase the operating speed of the n-type MOS transistor using the first region of the first semiconductor layer as a channel layer. Further, compressive strain is induced in the second semiconductor layer formed on the second region of the first semiconductor layer at the time of its epitaxial growth on the first semiconductor layer. As a result, it is possible to increase the operating speed of the p-type MOS transistor using the second semiconductor layer on the second region as a channel layer.

The time of exposure to energy lines may be longer than or equal to 1 ns and shorter than or equal to 10 ms. The exposure to energy lines may be performed by emitting laser light in a pulse-like manner. Heating for a short period of time makes it possible to suppress or prevent diffusion of atoms forming the second semiconductor layer from diffusing into the first semiconductor layer.

Further, the energy lines may be selected from the group consisting of ultraviolet, visible light, and infrared. Further, the energy lines may be ultraviolet laser light. Ultraviolet laser light enters only the topmost surface of the second semiconductor layer, and the energy is converted into heat at the topmost surface so as to be conducted in the depth direction, thereby avoiding overheating the second semiconductor layer. As a result, diffusion of atoms forming the second semiconductor layer into the first semiconductor layer is suppressed or prevented.

The second semiconductor layer may be formed of a layered body having multiple layers. The layered body may be formed so that one of the layers of the layered body in contact with the first semiconductor layer has a lattice constant whose difference from the lattice constant of the first semiconductor layer in the in-plane direction is great and the difference in lattice constant from the first semiconductor layer gradually decreases in the remaining layers in the stacking direction of the layered body. Since the one of the layers of the layered body in contact with the first semiconductor layer has a lattice constant whose difference from the lattice constant of the first semiconductor layer in the in-plane direction is great, it is possible to apply a greater stress to the first semiconductor layer. In addition, since the layers of the layered body are stacked in order the difference in lattice constant gradually decreases in the stacking direction of the layered body, the occurrence of a defect in the layered body is suppressed while ensuring thickness. As a result, by forming a thick layered body having good crystallinity, it is possible to support the one of the layers of the layered body in contact with the first semiconductor layer and apply stress to the first semiconductor layer.

According to one embodiment of the present invention, there is provided a method of manufacturing a semiconductor device, the semiconductor device including a substrate; an insulating film formed on the substrate; a Si film in which strain is induced in directions parallel to a surface of the substrate, the Si film being on the insulating film; a Ge film formed on the Si film; a source region and a drain region formed in the Ge film; and a gate layered body formed of a gate insulating film and a gate electrode on the Ge film, the method including the steps of: (a) forming a semiconductor layer by epitaxial growth on the Si film; (b) inducing the strain in the Si film by exposing the semiconductor layer to energy lines; (c) removing the semiconductor layer; and (d) forming the Ge film by epitaxial growth on the strain-induced Si film, wherein the semiconductor layer is greater in lattice constant in an in-plane direction than the Si film.

According to this embodiment, since tensile strain is induced in the Si film, the Si film has a lattice constant approximate to that of a Ge film, so that it is possible to form a Ge film of good crystallinity. Since Ge is greater in electron mobility and hole mobility than Si, it is possible to form a transistor capable of high-speed operation using the Ge film as a channel layer.

According to one embodiment of the present invention, there is provided a semiconductor device including: a substrate; an insulating film formed on the substrate; a first semiconductor layer having a first region and a second region, the first region having tensile strain in directions parallel to a surface of the substrate, the first semiconductor layer being formed on the insulating film; an n-type MOS transistor including a source region and a drain region formed in the first region, and a gate insulating film and a gate electrode on the first semiconductor layer in the first region; a second semiconductor layer having compressive strain in the directions parallel to the surface of the substrate, the second semiconductor layer being formed on the first semiconductor layer in the second region; and a p-type MOS transistor including a source region and a drain region formed in the second semiconductor layer, and a gate insulating film and a gate electrode on the second semiconductor layer, wherein the second semiconductor layer is greater in lattice constant in an in-plane direction than the first semiconductor layer in a strain-free condition.

According to this embodiment, the channel of the n-type MOS transistor is formed in the tensile strain-induced first semiconductor layer having high electron mobility, and the p-type MOS transistor is formed in the compressive strain-induced second semiconductor layer having high hole mobility. Therefore, it is possible to realize a semiconductor device in which the n-type MOS transistor and the p-type MOS transistor can operate at high speed.

According to one embodiment of the present invention, there is provided a semiconductor substrate including: a substrate; an insulating film formed on the substrate; and a Si film in which tensile strain is induced in directions parallel to a surface of the substrate, the Si film being on the insulating film, wherein a maximum value of moving averages of Ge content of the Si film in a depth direction thereof according to secondary ion mass spectrometry is less than or equal to $3 \times 10^{18}$ atoms/cm$^{-3}$.

According to this embodiment, the maximum value of the moving averages of the Ge content of the Si film in the depth direction thereof is less than or equal to $3 \times 10^{18}$ atoms/cm$^{-3}$. As a result, in the case of using the tensile strain-induced Si film as a channel, electron mobility is improved and an increase in the interface state is suppressed, so that it is possible to prevent a decrease in carrier mobility. Further, it is possible to suppress the degradation of the crystallinity of the strained Si film due to oxidation and vaporization of Ge atoms when the Si film is exposed to an oxygen atmosphere, so that it is possible to provide a high-quality Si film in which tensile strain is induced.

According to one embodiment of the present invention, there is provided a semiconductor substrate including: a substrate; an insulating film formed on the substrate; and a Si film in which tensile strain is induced in directions parallel to a surface of the substrate, the Si film being on the insulating film, wherein a depth from a surface of the Si film at which Ge content thereof according to secondary ion mass spectrometry is less than or equal to $2 \times 10^{18}$ atoms/cm$^{-3}$ is less than or equal to 3 nm.

According to this embodiment, Ge atoms are contained in only an extremely shallow region at the surface of the Si film in which tensile strain is induced. Accordingly, in the case of applying the technique of reducing the vertical dimension of a semiconductor device in order to realize a semiconductor device that operates at high speed, it is possible to reduce the degree of adverse effects exerted by Ge atoms, such as formation of interface state and degradation of crystallinity, compared with an SOI substrate having a conventional strained Si film.

According to one embodiment of the present invention, there is provided a method of manufacturing a semiconductor substrate, the semiconductor substrate including a substrate; an insulating film formed on the substrate; and a first semiconductor layer in which strain is induced in directions parallel to a surface of the substrate, the first semiconductor layer being on the insulating film, the method including the steps of: (a) forming a second semiconductor layer by epitaxial growth on the first semiconductor layer; (b) heating the second semiconductor layer; and (c) removing the second semiconductor layer, wherein the second semiconductor layer is different in lattice constant in an in-plane direction from the first semiconductor layer; and step (b) induces the strain in the first semiconductor layer by exposing a surface of the second semiconductor layer to energy lines.

According to one embodiment of the present invention, there is provided a method of manufacturing a semiconductor substrate, the semiconductor substrate including a substrate; an insulating film formed on the substrate; a Si film in which strain is induced in directions parallel to a surface of the substrate, the Si film being on the insulating film; and a Ge film formed on the Si film, the method including the steps of: (a) forming a semiconductor layer by epitaxial growth on the Si film; (b) heating the semiconductor layer; (c) removing the semiconductor layer; and (d) forming the Ge film by epitaxial growth on the strain-induced Si film, wherein the semiconductor layer is greater in lattice constant in an in-plane direction than the Si film; and step (b) induces the strain in the Si film by exposing a surface of the semiconductor layer to energy lines.

According to this embodiment, the second semiconductor layer that induces strain is formed on the first semiconductor layer, and the second semiconductor layer is heated by being exposed to energy lines, so that strain is induced in the first semiconductor layer, thereby making it possible to increase electron mobility or hole mobility. Further, since the second semiconductor layer is removed, it is possible to prevent the atoms of an element forming the second semiconductor layer from diffusing into and remaining in the first semiconductor layer. As a result, it is possible to realize a semiconductor substrate having a strain-induced, high-quality semiconductor layer (first semiconductor layer).

According to one embodiment of the present invention, there is provided a method of manufacturing a semiconductor substrate, the semiconductor substrate including a substrate; an insulating film formed on the substrate; a first semiconductor layer having a first region in which tensile strain is induced in directions parallel to a surface of the substrate, the first semiconductor layer being formed on the insulating film; and a second semiconductor layer formed on a second region of the first semiconductor layer, the method including the steps of: (a) forming the second semiconductor layer by epitaxial growth on the first semiconductor layer; (b) heating the second semiconductor layer on the first region of the first semiconductor layer; and (c) removing the second semiconductor layer on the first region of the first semiconductor layer, wherein the second semiconductor layer is greater in lattice constant in an in-plane direction than the first semiconductor layer; and step (b) induces the tensile strain in the first semiconductor layer by exposing a surface of the second semiconductor layer to energy lines.

The present invention is not limited to the specifically disclosed embodiments, and variations and modifications may be made without departing from the scope of the present invention.

What is claimed is:

1. A method of manufacturing a semiconductor device, the semiconductor device including a substrate; an insulating film formed on the substrate; a first semiconductor layer in which strain is induced in directions parallel to a surface of the substrate, the first semiconductor layer being on the insulating film; a source region and a drain region formed in the first semiconductor layer; and a gate layered body formed of a gate insulating film and a gate electrode on the first semiconductor layer, the method comprising:

forming a second semiconductor layer by epitaxial growth on the first semiconductor layer;
heating the second semiconductor layer;
removing the second semiconductor layer; and
overetching a surface of the first semiconductor layer from which the second semiconductor layer has been removed,
wherein the second semiconductor layer is different in lattice constant in an in-plane direction from the first semiconductor layer;
said heating the second semiconductor layer induces the strain in the first semiconductor layer by exposing a surface of the second semiconductor layer to energy lines;
the second semiconductor layer comprises a layered body having a plurality of layers; and
a first one of the layers of the layered body at a surface thereof comprises a material higher in absorbance of the energy lines than a second one of the layers of the layered body in contact with the first semiconductor layer.

2. The method as claimed in claim 1, wherein a time of the exposure to the energy lines is within a range of 1 ns to 10 ms.

3. The method as claimed in claim 1, wherein:
the first semiconductor layer comprises a Si film;
the second semiconductor layer comprises a SiGe film; and
the SiGe film has a Ge concentration higher than or equal to 10 at. % and lower than or equal to 40 at. %.

4. The method as claimed in claim 1, wherein:
a difference between a lattice constant of the first semiconductor layer in the in-plane direction and a lattice constant of the layered body decreases layer by layer in a direction away from the first semiconductor layer.

5. A method of manufacturing a semiconductor device, the semiconductor device including a substrate; an insulating film formed on the substrate; a first semiconductor layer formed on the insulating film; an n-type MOS transistor formed in a first region of the first semiconductor layer; a second semiconductor layer formed on a second region of the first semiconductor layer; and a p-type MOS transistor formed in the second semiconductor layer, the method comprising:

forming the second semiconductor layer by epitaxial growth on the first semiconductor layer;
heating the second semiconductor layer on the first region of the first semiconductor layer; and
removing the second semiconductor layer on the first region of the first semiconductor layer,
wherein the second semiconductor layer is greater in lattice constant in an in-plane direction than the first semiconductor layer in a strain-free condition;
said heating the second semiconductor layer induces tensile strain in the first semiconductor layer by exposing a surface of the second semiconductor layer to energy lines;
the second semiconductor layer comprises a layered body having a plurality of layers; and
a first one of the layers of the layered body at a surface thereof comprises a material higher in absorbance of the energy lines than a second one of the layers of the layered body in contact with the first semiconductor layer.

6. The method as claimed in claim 5, wherein a time of the exposure to the energy lines is within a range of 1 ns to 10 ms.

7. The method as claimed in claim 5, wherein:
the first semiconductor layer comprises a Si film;
the second semiconductor layer comprises a SiGe film; and
the SiGe film has a Ge concentration higher than or equal to 10 at. % and lower than or equal to 40 at. %.

8. The method as claimed in claim 5, wherein:
a difference between a lattice constant of the first semiconductor layer in the in-plane direction and a lattice constant of the layered body decreases layer by layer in a direction away from the first semiconductor layer.

9. The method as claimed in claim 5, wherein said heating the second semiconductor layer selectively exposes the second semiconductor layer on the first region of the first semiconductor layer to the energy lines.

10. The method as claimed in claim 5, further comprising:
forming a groove part to expose the insulating film between the first region and the second region before said heating the second semiconductor layer.

11. A method of manufacturing a semiconductor substrate, the semiconductor substrate including a substrate; an insulating film formed on the substrate; and a first semiconductor layer in which strain is induced in directions parallel to a surface of the substrate, the first semiconductor layer being on the insulating film, the method comprising:
forming a second semiconductor layer by epitaxial growth on the first semiconductor layer;
heating the second semiconductor layer;
removing the second semiconductor layer; and
overetching a surface of the first semiconductor layer from which the second semiconductor layer has been removed,
wherein the second semiconductor layer is different in lattice constant in an in-plane direction from the first semiconductor layer;
said heating the second semiconductor layer induces the strain in the first semiconductor layer by exposing a surface of the second semiconductor layer to energy lines;
the second semiconductor layer comprises a layered body having a plurality of layers; and
a first one of the layers of the layered body at a surface thereof comprises a material higher in absorbance of the energy lines than a second one of the layers of the layered body in contact with the first semiconductor layer.

12. A method of manufacturing a semiconductor substrate, the semiconductor substrate including a substrate; an insulating film formed on the substrate; a first semiconductor layer having a first region in which tensile strain is induced in directions parallel to a surface of the substrate, the first semiconductor layer being formed on the insulating film; and a second semiconductor layer formed on a second region of the first semiconductor layer, the method comprising:
forming the second semiconductor layer by epitaxial growth on the first semiconductor layer;
heating the second semiconductor layer on the first region of the first semiconductor layer; and
removing the second semiconductor layer on the first region of the first semiconductor layer,
wherein the second semiconductor layer is greater in lattice constant in an in-plane direction than the first semiconductor layer;
said heating the second semiconductor layer induces the tensile strain in the first semiconductor layer by exposing a surface of the second semiconductor layer to energy lines;
the second semiconductor layer comprises a layered body having a plurality of layers; and
a first one of the layers of the layered body at a surface thereof comprises a material higher in absorbance of the energy lines than a second one of the layers of the layered body in contact with the first semiconductor layer.

* * * * *